(12) United States Patent
Kim et al.

(10) Patent No.: US 12,170,533 B2
(45) Date of Patent: Dec. 17, 2024

(54) SEMICONDUCTOR MEMORY DEVICE AND METHOD OF OPERATING SEMICONDUCTOR MEMORY DEVICE

(71) Applicant: Samsung Electronics Co., Ltd., Suwon-si (KR)

(72) Inventors: Sungrae Kim, Suwon-si (KR); Gilyoung Kang, Suwon-si (KR); Yujung Song, Suwon-si (KR); Hyeran Kim, Suwon-si (KR); Chisung Oh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/336,285

(22) Filed: Jun. 16, 2023

(65) Prior Publication Data
US 2024/0146335 A1    May 2, 2024

(30) Foreign Application Priority Data

Nov. 2, 2022  (KR) .................. 10-2022-0144414

(51) Int. Cl.
*H03M 13/29*  (2006.01)
*G06F 3/06*   (2006.01)
(Continued)

(52) U.S. Cl.
CPC ....... *H03M 13/2909* (2013.01); *G06F 3/0611* (2013.01); *G06F 3/0619* (2013.01); *G06F 3/0659* (2013.01); *G06F 3/0661* (2013.01); *G06F 3/0673* (2013.01); *G06F 3/0679* (2013.01); *G06F 11/10* (2013.01);
(Continued)

(58) Field of Classification Search
CPC .......... H03M 13/2909; H03M 13/1575; G06F 3/0611; G06F 3/0619; G06F 3/0659; G06F 3/0661; G06F 3/0673; G06F 3/0679; G06F 11/10; G06F 11/1032; G06F 11/1048; G11C 11/4096; G11C 29/42; G11C 29/52
USPC ....... 714/755, 757, 758, 763, 768, 769, 773, 714/785, 799, 800
See application file for complete search history.

(56) References Cited

U.S. PATENT DOCUMENTS 7,836,375 B2   11/2010   Ariyama
8,301,912 B2   10/2012   Lin et al.
(Continued)

OTHER PUBLICATIONS

Hoshizawa et al., Random Seed Scrambling Method For High Density Phase Change Optical Discs, 2002, IEEE, pp. 186-188. (Year : 2002).*

*Primary Examiner* — John J Tabone, Jr.
(74) *Attorney, Agent, or Firm* — Myers Bigel, P.A.

(57) ABSTRACT

A semiconductor memory device includes a memory cell array and an on-die error correction code (ECC) engine. The on-die ECC engine, during a write operation, generates a second main data by encoding a first main data with a random binary code, performs an ECC encoding on the second main data to generate a parity data and stores the second main data and the parity data in a target page in the memory cell array. The on-die ECC engine, during a read operation, reads the second main data and the parity data from the target page, performs an ECC decoding on the second main data based on the parity data to generate a syndrome in parallel with generating the first main data by encoding the second main data with the random binary code and corrects at least one error bit in the first main data based on the syndrome.

20 Claims, 25 Drawing Sheets

(51) Int. Cl.
  *G06F 11/10* (2006.01)
  *G11C 11/4096* (2006.01)
  *G11C 29/42* (2006.01)
  *G11C 29/52* (2006.01)
  *H03M 13/15* (2006.01)

(52) U.S. Cl.
  CPC ...... *G06F 11/1032* (2013.01); *G06F 11/1048* (2013.01); *G11C 11/4096* (2013.01); *G11C 29/42* (2013.01); *G11C 29/52* (2013.01); *H03M 13/1575* (2013.01)

(56) References Cited

U.S. PATENT DOCUMENTS

| | | | |
|---|---|---|---|
| 8,402,349 | B2 | 3/2013 | Lee et al. |
| 8,666,068 | B2 | 3/2014 | Sharon et al. |
| 8,713,379 | B2 | 4/2014 | Takefman et al. |
| 8,984,373 | B2 * | 3/2015 | Yang .................. G06F 11/1048 714/766 |
| 9,086,456 | B2 | 7/2015 | Yen et al. |
| 9,459,955 | B2 * | 10/2016 | Tuers .................. G06F 11/1012 |
| 10,121,013 | B2 | 11/2018 | Chang et al. |
| 10,691,530 | B2 | 6/2020 | Kim |
| 2013/0219247 | A1 * | 8/2013 | Yang .................. G06F 11/1048 714/766 |
| 2022/0374309 | A1 * | 11/2022 | Kim .................. G06F 11/1048 |
| 2024/0146335 | A1 * | 5/2024 | Kim ........................ G06F 11/10 |

\* cited by examiner

| SDU11 | SDU12 | ... | SDU1t |

DQ11~DQ18

MD2

| SDU21 | SDU22 | ... | SDU2t |

DQ21~DQ28

RBC

| CB1 | CB2 | ... | CBt |

410

430

SEMICONDUCTOR MEMORY DEVICE AND METHOD OF OPERATING SEMICONDUCTOR MEMORY DEVICE

CROSS-REFERENCE TO RELATED APPLICATIONS

This application claims priority under 35 U.S.C. § 119 to Korean Patent Application No. 10-2022-0144414, filed on Nov. 2, 2022, in the Korean Intellectual Property Office, the disclosure of which is incorporated by reference herein in its entirety.

BACKGROUND

The present disclosure relates to memories, and more particularly to a semiconductor memory device and a method of operating a semiconductor memory device.

Semiconductor memory devices may be classified into non-volatile memory devices, such as flash memory devices, and volatile memory devices such as dynamic random access memories (DRAMs). High-speed operation and cost efficiency of DRAMs make it possible for DRAMs to be used for system memories. Due to the continuing shrink in integrated circuit (IC) dimensions resulting, at least in part, from the scaling of IC fabrication design rules of DRAMs, capacitance of a capacitor included in a memory cell will decrease, and thus noise may occur according to a format of data stored in a memory core.

SUMMARY

Some example embodiments provide a semiconductor memory device capable of enhancing operating characteristics and reducing a size of logic.

Some example embodiments provide a method of operating a semiconductor memory device, capable of enhancing operating characteristics and reducing a size of logic.

According to some example embodiments, a semiconductor memory device includes a memory cell array, an on-die error correction code (ECC) engine and a control logic circuit. The on-die ECC engine, during a write operation, may generate a second main data by scrambling (i.e., encoding) a first main data received from an external device with a random binary code received from the control logic circuit, perform an ECC encoding on the second main data to generate a parity data, and store the second main data and the parity data in a target page in the memory cell array. The on-die ECC engine, during a read operation, may read the second main data and the parity data from the target page, perform an ECC decoding on the second main data based on the parity data to generate a syndrome in parallel with generating the first main data by scrambling the second main data with random binary code, and correct at least one error bit in the first main data based on the syndrome.

According to some example embodiments, a semiconductor memory device includes a memory cell array, an on-die error correction code (ECC) engine and a control logic circuit. The on-die ECC engine, during a write operation, may generate a scrambled main data by scrambling (i.e., encoding) a main data received from an external device with a random binary code received from the control logic circuit, perform an ECC encoding on the scrambled main data to generate a parity data, and store the scrambled main data and the parity data in a target page in the memory cell array. The on-die ECC engine, during a read operation, reads the scrambled main data and the parity data from the target page, performs an ECC decoding on the scrambled main data based on the parity data to generate a syndrome in parallel with generating the main data by scrambling the scrambled main data with random binary code and corrects at least one error bit in the main data based on the syndrome.

According to some example embodiments, in a method of operating a semiconductor memory device that includes a memory cell array including a plurality of memory cells coupled to a plurality of word-lines and a plurality of bit-lines and an on-die error correction code (ECC) engine, a second main data is generated, by the on-die ECC engine, by scrambling (i.e., encoding) a first main data with a random binary code, the second main data and a parity data generated based on the first main data are stored in a target page in the memory cell array, an ECC decoding is performed, by the on-die ECC engine, on the second main data read from the target page based on the parity data read from the target page to generate a syndrome in parallel with generating the first main data by scrambling (i.e., encoding) the second main data with a random binary code, and at least one error bit in the first main data is corrected based on the syndrome by the on-die ECC engine.

Accordingly, the semiconductor memory device according to example embodiments, generates the first main data by scrambling (i.e., encoding) the second main data with the random binary code in parallel with generating a syndrome by performing an ECC decoding on the second main data read from the memory cell array and corrects at least one error bit in the first main data based on the syndrome. Because the semiconductor memory device does not perform data scrambling (i.e., encoding) after performing the ECC decoding, the data scrambling does not need extra time. Therefore, the semiconductor memory device according to aspects of the present inventive concept may reduce latency associated with the read operation while reducing pattern noise that occurs when fixed data patterns are repeated and may reduce a size of logic circuitry associated with the data scrambling.

BRIEF DESCRIPTION OF THE DRAWINGS

The following drawings are presented by way of example only and without limitation, wherein like reference numerals (when used) indicate corresponding elements throughout the several views, and wherein:

FIG. 8 illustrates examples of the first main data, the second main data and the random binary code in the on-die ECC engine in FIG. 7 according to example embodiments;

DETAILED DESCRIPTION

Figure 1:
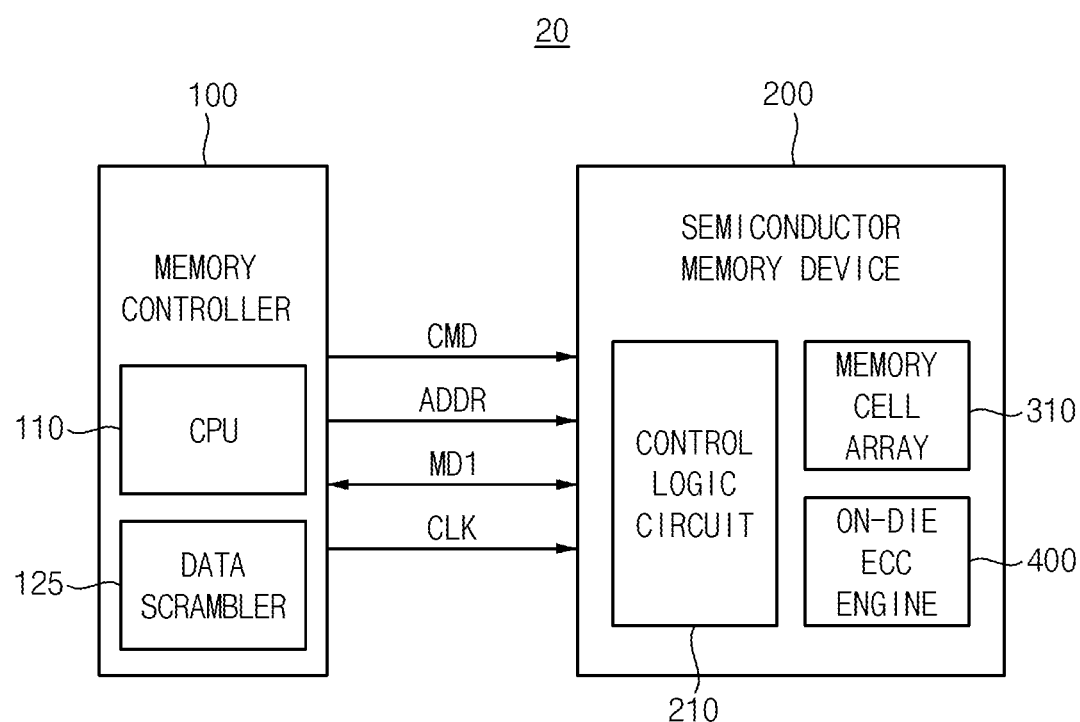
FIG. 1 is a block diagram illustrating a memory system according to example embodiments.

Various example embodiments of the present disclosure will be described more fully hereinafter with reference to the accompanying drawings. Like reference numerals may refer to like elements throughout the accompanying drawings.

FIG. 1 is a block diagram illustrating a memory system according to example embodiments of the present disclosure.

Referring to FIG. 1, a memory system 20 may include a memory controller 100 (e.g., an external device) and a semiconductor memory device 200.

The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to a request from the host. In addition, the memory controller 100 may issue operation commands to the semiconductor memory device 200 for controlling the semiconductor memory device 200.

In example embodiments, the semiconductor memory device 200 is a memory device including a plurality of dynamic (volatile) memory cells such as a dynamic random access memory (DRAM), or a graphic double data rate 7 (GDDR7) synchronous DRAM (SDRAM).

The memory controller 100, in one or more embodiments, may be configured to transmit a clock signal CLK, a command CMD, and an address (signal) ADDR to the semiconductor memory device 200, and to exchange a first main data MD1 with the semiconductor memory device 200.

The memory controller 100 may include a central processing unit (CPU) 110 and a data scrambler (i.e., encoder) 125.

The CPU 110 may control overall operation of the memory controller 100 and the data scrambler 125 may generate the first main data MD1 by scrambling (i.e., encoding) an original main data based on a user data with a random binary code.

The semiconductor memory device 200 may include a memory cell array 310 that stores a second main data corresponding to the first main data MD1, an on-die error correction code (ECC) engine 400 and a control logic circuit 210. In one or more embodiments, the CPU 110 may be configured to determine whether the on-die ECC engine 400 is operating normally based on a severity signal (or other indicator) which may be generated in a test mode of the semiconductor memory device 200. The memory cell array 310 may include a plurality of sub-array blocks arranged in a first direction and a second direction, the second direction intersecting with the first direction (not explicitly shown, but implied).

The on-die ECC engine 400, during a write operation, may generate the second main data by scrambling the first main data MD1 with a random binary code received from the control logic circuit 210, may perform an ECC encoding on the second main data to generate a parity data, and may store the second main data and the parity data in a target page in the memory cell array 310.

The on-die ECC engine 400, during a read operation, may read the second main data and the parity data from the target page, perform an ECC decoding on the second main data based on the parity data to generate a syndrome in parallel with generating the first main data MD1 by scrambling the second main data with a random binary code, and may correct at least one error bit in the first main data MD1 based on the syndrome.

Each of the first main data MD1 and the second main data may include a plurality of data bits, and the plurality of data bits may be divided into a plurality of sub-data units. The first main data MD1 may include a plurality of first sub-data units and the second main data may include a plurality of second sub-data units.

The semiconductor memory device 200 may perform a burst operation. Herein, the "burst operation" refers to an operation of writing or reading a large amount of data by sequentially increasing or decreasing an initial address provided from the memory controller 100. A basic unit of the burst operation may be referred to a burst length BL. In example embodiments, the burst length BL may refer to the number of operations of continuously reading or writing data by sequentially increasing or decreasing an initial address.

Figure 2:
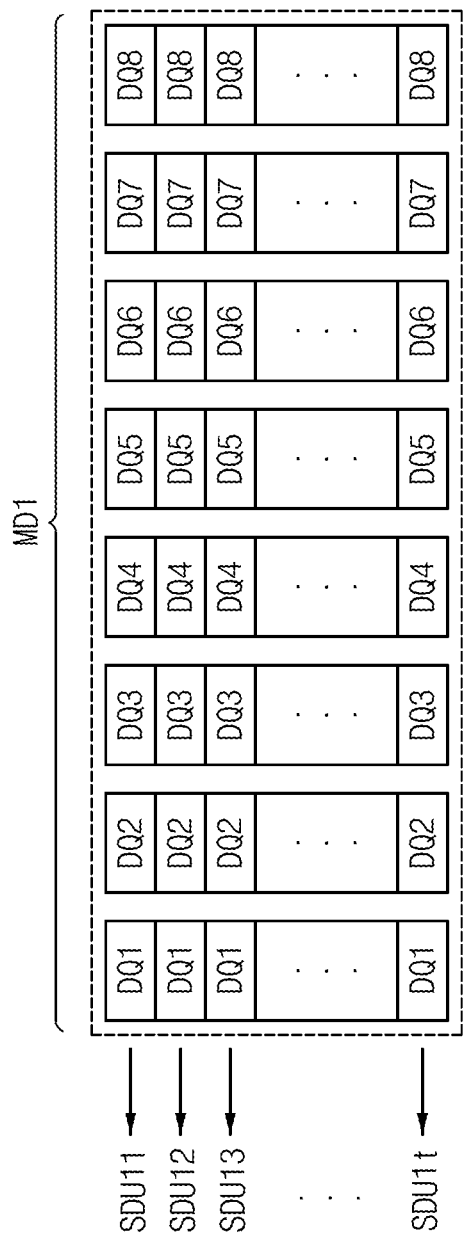
FIG. 2 illustrates a first main data corresponding to the plurality of burst lengths in the memory system of FIG. 1 according to some example embodiments.

FIG. 2 illustrates a first main data MD1 corresponding to the plurality of burst lengths in the memory system of FIG. 1, according to some example embodiments.

Referring to FIG. 2, the first main data MD1 corresponding to the plurality of burst lengths may be input to/output from the semiconductor memory device 200 (see FIG. 1). The first main data MD1 may include a plurality of first sub-data units SDU11, SDU12, SDU13, ..., SDU1$t$ (where $t$ is a natural number equal to or greater than 8), each of the first sub-data units corresponding to each of the plurality of burst lengths. The burst length is assumed to be 32 in FIG. 2, although embodiments of the invention are not limited to a specific burst length. The second main data, corresponding to the first main data MD1 corresponding to the plurality of burst lengths, may be stored in the memory cell array 310 of the semiconductor memory device 200 (see FIG. 1).

Figure 3:
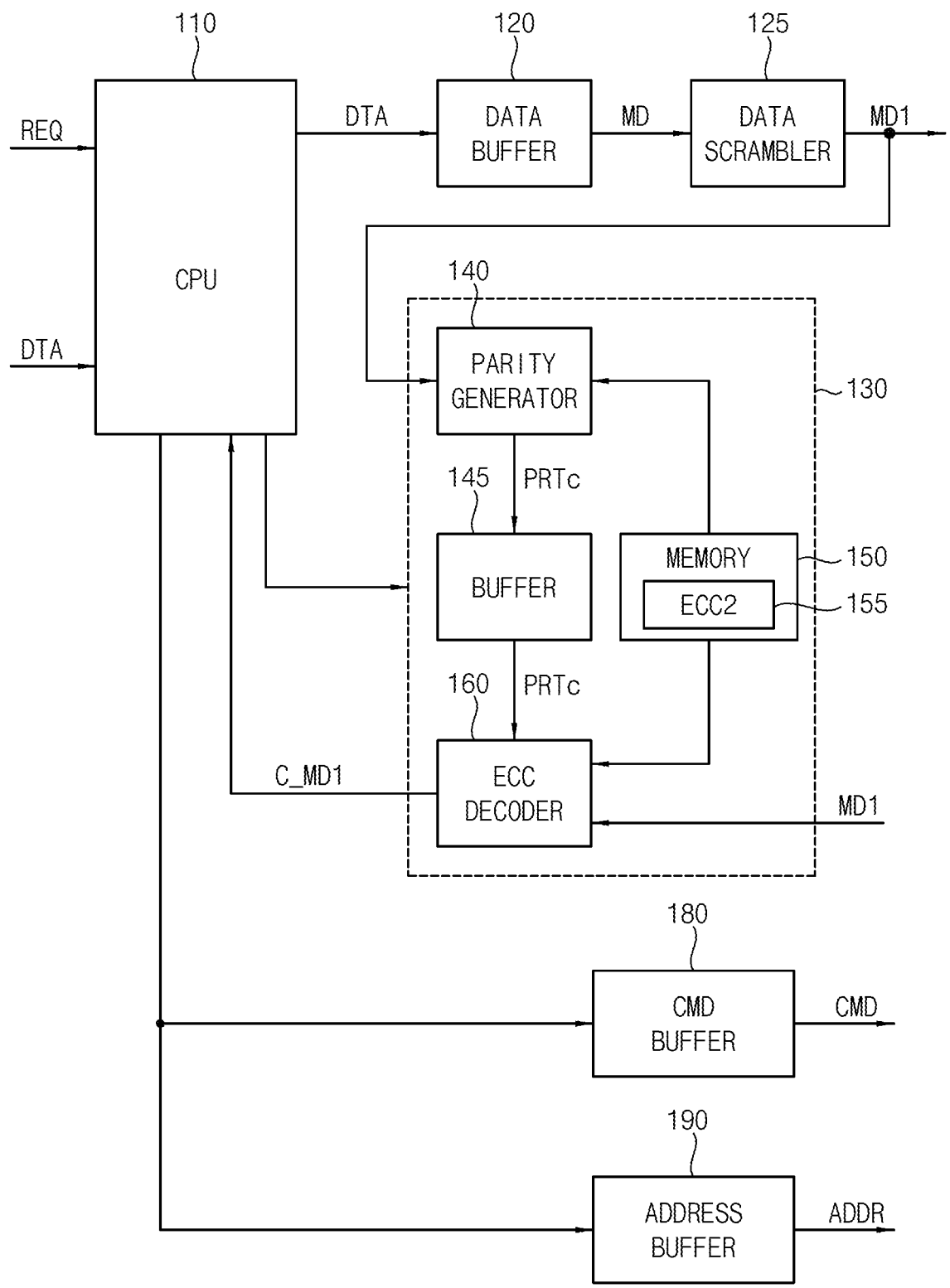
FIG. 3 is a block diagram illustrating an example of the memory controller in FIG. 1 according to some example embodiments.

FIG. 3 is a block diagram illustrating at least a portion of the exemplary memory controller 100 shown in FIG. 1, according to some example embodiments.

Referring to FIG. 3, the memory controller 100 may include the CPU 110, a data buffer 120, the data scrambler 125, a (system) ECC engine 130, a command buffer 180 and an address buffer 190. The ECC engine 130 may include a parity generator 140, a buffer 145, a memory 150 configured to store a second ECC (ECC2) 155, and an ECC decoder 160.

The CPU 110 may receive a request REQ and data DTA from the host (external to the memory controller 100), and may provide the data DTA to the data buffer 120 and the parity generator 140.

The data buffer 120 may buffer the data DTA to provide an original main data MD to the data scrambler 125.

The data scrambler 125 may generate the first main data MD1 based on data bits of the original main data MD combined with a random binary code RBC and may provide the first main data MD1 to the parity generator 140 and the semiconductor memory device 200 (see FIG. 1).

The parity generator 140 is connected to the memory 150, may perform an ECC encoding on the first main data MD1 using the second ECC 155 to generate a parity data PRTc, and may store the parity data PRTc in the buffer 145.

The ECC decoder 160, during a read operation of the semiconductor memory device 200, may receive the first main data MD1 from the semiconductor memory device 200, may perform an ECC decoding on the first main data MD1 by using the second ECC (ECC2) 155 and the system parity data PRTc, and may provide a corrected main data C_MD1 to the CPU 110. The CPU 110 may provide the corrected main data C_MD1 to the host.

The command buffer 180 may store the command CMD corresponding to the request REQ and may transmit the command CMD to the semiconductor memory device 200 (see FIG. 1) under control of the CPU 110. The address buffer 190 may store the address ADDR and may transmit the address ADDR to the semiconductor memory device 200 (see FIG. 1) under control of the CPU 110.

Figure 4:
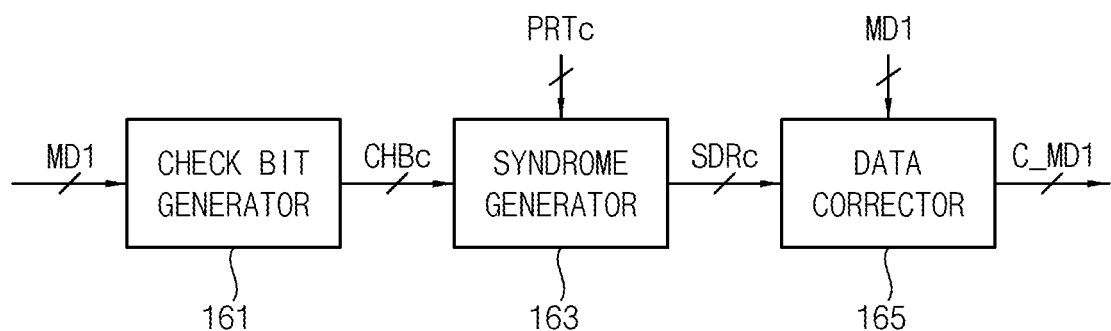
FIG. 4 is a block diagram illustrating an example of the ECC decoder in the memory controller of FIG. 3 according to example embodiments.

FIG. 4 is a block diagram illustrating at least a portion of the exemplary ECC decoder 160 in the memory controller 100 of FIG. 3, according to example embodiments.

Referring to FIG. 4, the ECC decoder 160 may include a check bit generator 161, a syndrome generator 163 and a data corrector 165.

The check bit generator 161 may receive the first main data MD1, and may generate check bits CHBc corresponding to the first main data MD1 using the second ECC 155.

The syndrome generator 163 may compare the parity data PRTc and the check bits CHBc bit by bit to generate a syndrome data SDRc indicating whether the first main data MD1 includes at least one error bit and indicating a position of the at least one error bit in the first main data MD1 stream.

The data corrector 165 may receive the first main data MD1 and may correct the error bit(s) in the first main data MD1 based, at least in part, on the syndrome data SDRc to output the corrected main data C_MD1.

Figure 5:
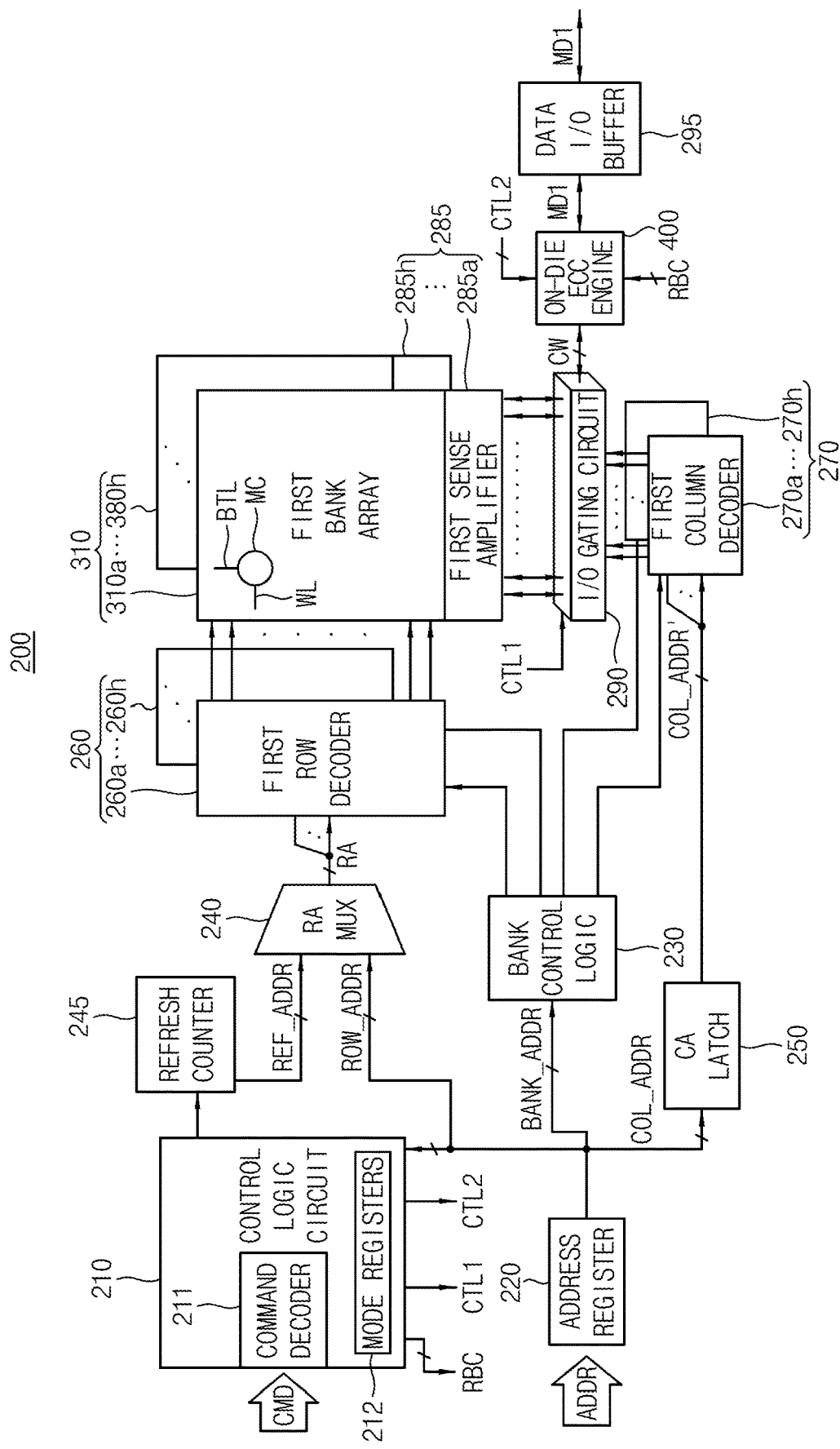
FIG. 5 is a block diagram illustrating an example of the semiconductor memory device in the memory system of FIG. 1 according to example embodiments.

FIG. 5 is a block diagram illustrating at least a portion of the exemplary semiconductor memory device 200 in the illustrative memory system 20 of FIG. 1, according to example embodiments.

Referring to FIG. 5, the semiconductor memory device 200 may include the control logic circuit 210, an address register 220, a bank control logic 230, a refresh counter 245, a row address (RA) multiplexer 240, a column address (CA) latch 250, a row decoder 260, a column decoder 270, the memory cell array 310, a sense amplifier unit 285, an input/output (I/O) gating circuit 290, the on-die ECC engine 400 and a data I/O buffer 295.

The memory cell array 310 may include first through eighth bank arrays 310$a$-310$h$, although embodiments of the present inventive concept are not limited to this or any specific number of bank arrays. The row decoder 260 may include first through eighth bank row decoders 260$a$~260$h$ respectively coupled to the first through eighth bank arrays 310$a$-310$h$, the column decoder 270 may include first through eighth bank column decoders 270$a$~270$h$ respectively coupled to the first through eighth bank arrays 310$a$-310$h$, and the sense amplifier unit 285 may include first through eighth bank sense amplifiers 285$a$~285$h$ respectively coupled to the first through eighth bank arrays 310$a$-310$h$.

The first through eighth bank arrays 310$a$-310$h$, the first through eighth bank row decoders 260$a$~260$h$, the first through eighth bank column decoders 270$a$~270$h$ and first through eighth bank sense amplifiers 285$a$~285$h$ may form first through eighth banks. Each of the first through eighth bank arrays 310$a$-310$h$ may include a plurality of volatile memory cells MC, the memory cells MC being preferably formed at unique intersections of a plurality of word-lines WL and a plurality of bit-line BTL.

The address register 220 may receive the address ADDR, including a bank address BANK_ADDR, a row address ROW_ADDR and a column address COL_ADDR, from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260$a$~260$h$ corresponding to the bank address BANK_ADDR may be activated in response to receipt of the corresponding one of the bank control signals, and one of the first through eighth bank column decoders 270$a$~270$h$ corresponding to the bank address BANK_ADDR may be activated in response to receipt of the corresponding one of the bank control signals.

The row address multiplexer 240 may receive the row address ROW_ADDR from the address register 220, and may receive a refresh row address REF_ADDR from the refresh control circuit 385. The row address multiplexer 240 selectively may output the row address ROW_ADDR or the refresh row address REF_ADDR as a row address RA. The row address RA that is output from the row address multiplexer 240 may be applied to the first through eighth bank row decoders 260a~260h.

The refresh counter 245 may sequentially increase or decrease the refresh row address REF_ADDR under control of the control logic circuit 210.

The control logic circuit 210 may be configured to receive the command CMD supplied from the memory controller 100 (see FIG. 1). When the command CMD from the memory controller 100 corresponds to an auto refresh command or a self-refresh entry command, the control logic circuit 210 may control the refresh counter 245 to output the refresh row address REF_ADDR sequentially.

The activated one of the first through eighth bank row decoders 260a~260h, by the bank control logic 230, may decode the row address RA that is output from the row address multiplexer 240, and may activate a word-line corresponding to the row address RA. For example, the activated row decoder may apply a word-line driving voltage to the word-line corresponding to the row address RA.

The column address latch 250 may receive the column address COL_ADDR from the address register 220, and may at least temporarily store the received column address COL_ADDR. In some embodiments, in a burst mode, the column address latch 250 may generate column address COL_ADDR' that increments from the received column address COL_ADDR. The column address latch 250 may apply the temporarily stored or generated column address COL_ADDR' to the first through eighth bank column decoders 270a~270h.

The activated one of the first through eighth column decoders 270a~270h may, in turn, activate a sense amplifier corresponding to the bank address BANK_ADDR and the column address COL_ADDR' through the I/O gating circuit 290.

The I/O gating circuit 290 may include circuitry for gating input/output data, and may further include input data mask logic, read data latches for storing data that is output from the first through eighth bank arrays 310a~310h, and write drivers for writing data to the first through eighth bank arrays 310a~310h.

A codeword CW read from a selected bank array of the first through eighth bank arrays 310a~310h may be sensed by a corresponding one of the first through eighth sense amplifiers 285a~285h coupled to the selected bank array from which the data is to be read, and may be stored in corresponding read data latches in the I/O gating circuit 290. The codeword CW stored in the read data latches may be provided to the on-die ECC engine 400. The on-die ECC engine 400 may generate the first main data MD1 by performing ECC decoding on the codeword CW and the first main data MD1 may be transmitted to the memory controller 100 via the data I/O buffer 295 after ECC decoding is performed on the codeword CW by the on-die ECC engine 400.

The first main data MD1 to be written in one bank array of the first through eighth bank arrays 310a-310h may be provided to the data I/O buffer 295 from the memory controller 100, and may be provided to the on-die ECC engine 400 from the data I/O buffer 295. The on-die ECC engine 400 may generate the second main data based on the first main data MD1, may generate parity data based on the second main data and may provide the I/O gating circuit 290 with the codeword CW including the second the main data and the parity data to the I/O gating circuit 290. The I/O gating circuit 290 may write the codeword CW in a sub-page of a target page in one bank array through the write drivers in the I/O gating circuit 290.

The data I/O buffer 295 may provide the first main data MD1 from the memory controller 100 to the on-die ECC engine 400 during a write operation of the semiconductor memory device 200, and may provide the first main data MD1 provided from the on-die ECC engine 400 to the memory controller 100 during the read operation of the semiconductor memory device 200.

The on-die ECC engine 400, during the write operation, may generate the second main data by scrambling (i.e., encoding) the first main data MD1 with a random binary code RBC received from the control logic circuit 210, may perform an ECC encoding on the second main data to generate the parity data, and may store the second main data and the parity data in a target page in the memory cell array 310.

The on-die ECC engine 400, during the read operation, may read the second main data and the parity data from the target page, perform an ECC decoding on the second main data based on the parity data to generate the syndrome in parallel with generating the first main data MD1 by scrambling the second main data with random binary code RBC, and may correct at least one error bit in the first main data MD1 based at least in part on the syndrome.

The control logic circuit 210 may control one or more operations of the semiconductor memory device 200. For example, the control logic circuit 210 may generate control signals for the semiconductor memory device 200 in order to perform a write operation, a read operation and operation in a test mode. The control logic circuit 210 may include a command decoder 211 configured to decode the command CMD received from the memory controller 100 and mode register 212 that sets an operation mode of the semiconductor memory device 200. The random binary code RBC may be set in the mode register 212 by the memory controller 100 and the control logic circuit 210 may provide the on-die ECC engine 400 with the random binary code RBC set in the mode register 212.

For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290 and a second control signal CTL2 to control the on-die ECC engine 400 by decoding the command CMD supplied to the control logic circuit 210.

Figure 6:
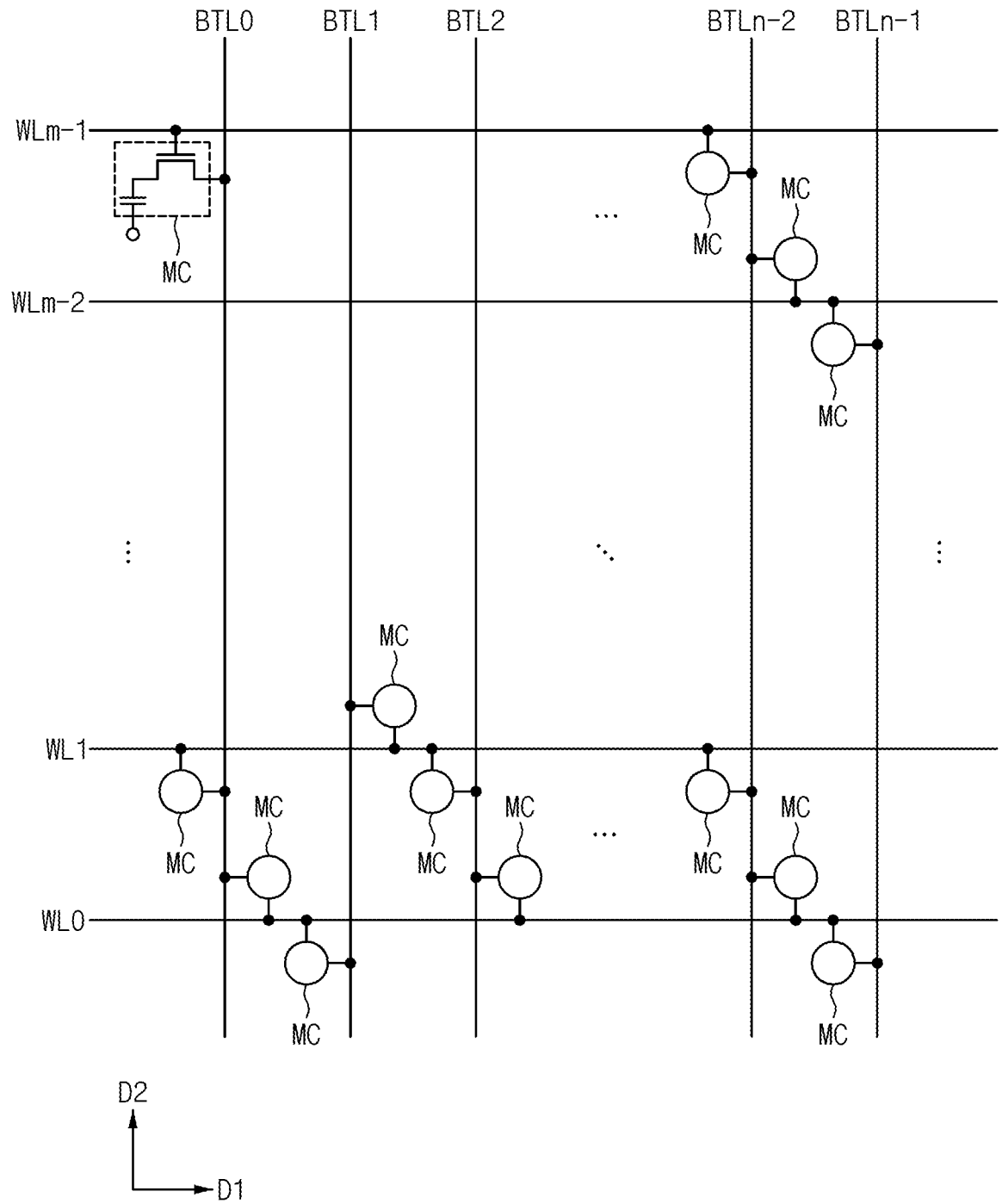
FIG. 6 illustrates an example of the first bank array in the semiconductor memory device of FIG. 5 according to example embodiments.

FIG. 6 illustrates an example of at least a portion of the first bank array 310a in the semiconductor memory device of FIG. 5, according to example embodiments.

Referring to FIG. 6, the first bank array 310a may include a plurality of word-lines WL0~WLm−1 (where m is an even number equal to or greater than two), a plurality of bit-lines BTL0~BTLn−1 (where n is an even number equal to or greater than two), and a plurality of memory cells MCs disposed at intersections between the word-lines WL0~WLm−1 and the bit-lines BTL0~BTLn−1.

The word-lines WL0~WLm−1 may extend in a first direction D1 (e.g., row or horizontal) and the bit-lines BTL0~BTLn−1 may extend in a second direction D2 (e.g., column or vertical direction). It is to be appreciated that embodiments of the present inventive concept are not limited to any specific orientation of the word-lines and bit-lines.

Each of the memory cells MCs includes an access (cell) transistor coupled to one of the word-lines WL0~WLm−1 and one of the bit-lines BTL0~BTLn−1, and a storage (cell) capacitor coupled to the cell transistor. That is, each of the memory cells MCs has a DRAM cell structure.

In addition, the memory cells MCs may have a different arrangement depending on whether the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line.

Figure 7:
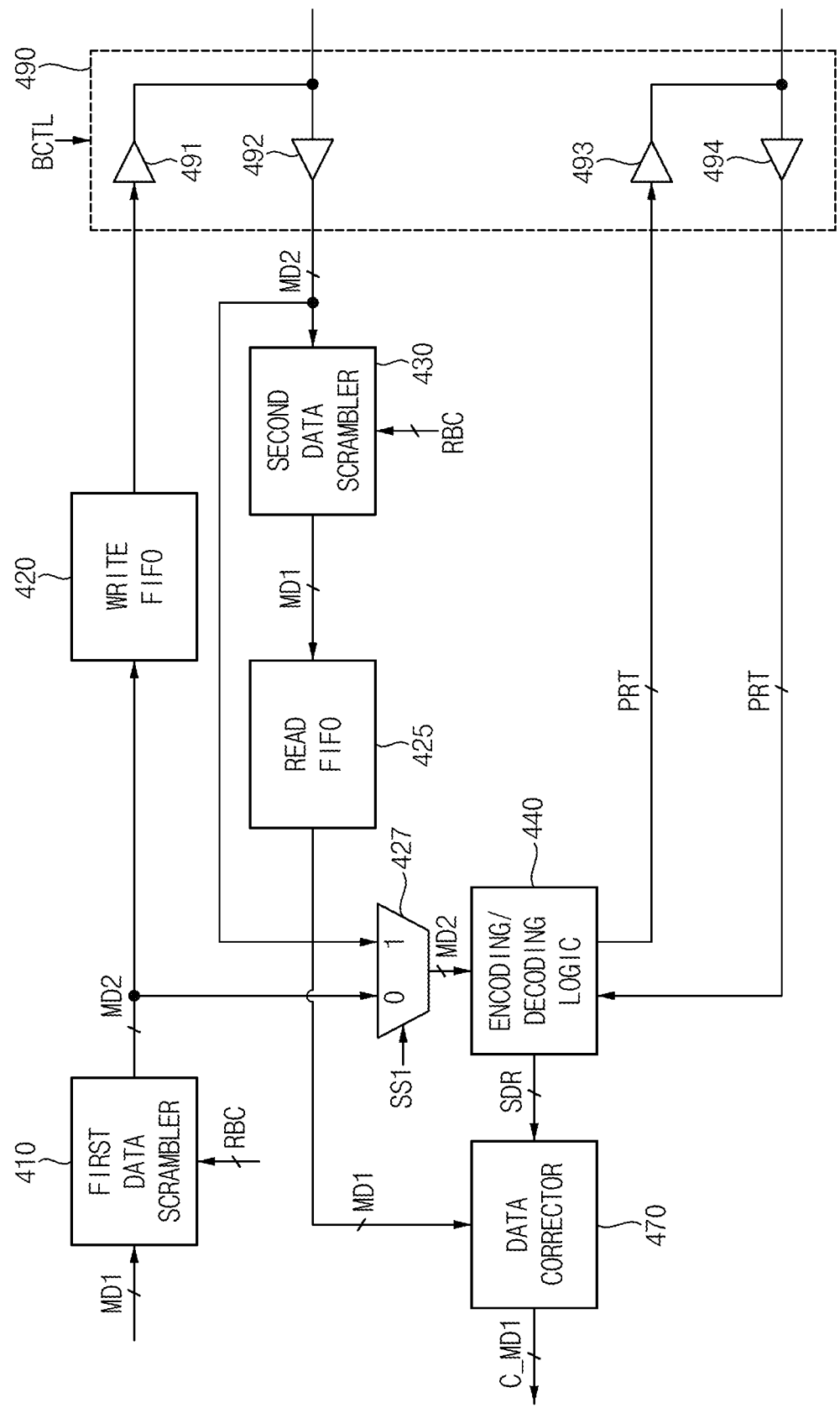
FIG. 7 is a block diagram illustrating an example of the on-die ECC engine in the semiconductor memory device of FIG. 5 according to example embodiments.

FIG. 7 is a block diagram illustrating at least a portion of the example on-die ECC engine 400 in the semiconductor memory device 200 of FIG. 5, according to example embodiments.

Referring to FIG. 7, the on-die ECC engine 400 may include a first data scrambler (encoder) 410, a write first-in, first-out (FIFO) register 420, a second data scrambler (encoder) 430, a read FIFO register 425, a multiplexer 427, an encoding/decoding logic 440, a data corrector 470, and a buffer circuit 490.

The buffer circuit 490 may include a plurality of buffers, for example buffers 491, 492, 493 and 494. Each of the buffers 491, 492, 493 and 494 may be non-inverting buffers, although inverting buffers are similarly contemplated. The buffers 491, 492, 493 and 494 may be controlled by a buffer control signal BCTL.

The first data scrambler 410 may generate a second main data MD2 by scrambling (i.e., encoding) the first main data MD1 with the random binary code RBC during the write operation and may store the second main data MD2 in the write FIFO register 420. The second main data MD2 stored in the write FIFO register 420 may be stored in the target page of the memory cell array 310 (see FIG. 5) through the buffer 491.

The multiplexer 427 may provide the encoding/decoding logic 440 with the second main data output MD2 from the first data scrambler 410 during the write operation and may provide the encoding/decoding logic 440 with the second main data MD2 read from the target page through the buffer 492, in response to a selection signal S Sl.

The second data scrambler 430 may receive the second main data MD2 from the buffer 492, may generate the first main data MD1 by scrambling (i.e., encoding) the second main data MD2 with the random binary code RBC, during the read operation, and may provide the first main data MD1 for storage in the read FIFO register 425. The read FIFO register 425 may provide the first main data MD1 to the data corrector 470. The first main data MD1 generated by the second data scrambler 430 may be referred to as a third main data. Because the third main data may be generated by scrambling the first main data MD1 with the random binary code RBC and the scrambling corresponds to an XOR operation, the third main data may correspond to the first main data MD1.

The encoding/decoding logic 440, during the write operation, may receive the second main data MD2 from the multiplexer 427, may generate a parity data PRT by performing an ECC encoding on the second main data MD2, and may provide the parity data PRT to the target page of the memory cell array 310 (see FIG. 5) through the buffer 493. The encoding/decoding logic 440, during the read operation, may receive the second main data MD2 from the multiplexer 427, may receive the parity data PRT from the buffer 494, may generate a syndrome SDR by performing an ECC decoding on the second main data MD2 and the parity data PRT and may provide the syndrome SDR to the data corrector 470.

During the read operation, the encoding/decoding logic 440 may generate the syndrome SDR by performing the ECC decoding on the second main data MD2 and the parity data PRT and may provide the syndrome SDR to the data corrector 470 in parallel with the second data scrambler 430 generating the first main data MD1 by scrambling the second main data MD2 with the random binary code RBC, and providing the first main data MD1 for storage in the read FIFO register 425.

The data corrector 470, during the read operation, may receive the first main data MD1 from the read FIFO register 425 and may output a corrected data C_MD1 by correcting at least one error bit in the first main data MD1 based on the syndrome SDR.

The buffer control signal BCTL and the selection signal SS1 in FIG. 7 may be included in the second control signal CTL2 in FIG. 5.

FIG. 8 illustrates examples of the first main data, the second main data and the random binary code RBC in the example on-die ECC engine 400 shown in FIG. 7, according to example embodiments.

Referring to FIG. 8, the first main data MD1 may include a plurality of first sub-data units SDU11, SDU12, . . . , SDU1t, and each of the plurality of first sub-data units SDU11, SDU12, . . . , SDU1t may include first data bits. For example, the first sub-data unit SDU11 may include first data bits DQ11~DQ18. Hereinafter, for convenience of explanation, it may be assumed that the each of the plurality of first sub-data units SDU11, SDU12, . . . , SDU1t includes the first data bits DQ11~DQ18.

The second main data MD2 may include a plurality of second sub-data units SDU21, SDU22, . . . , SDU2t and each of the plurality of second sub data units SDU21, SDU22, . . . , SDU2t may include second data bits. For example, the second sub-data unit SDU21 may include second data bits DQ21~DQ28. Hereinafter, for convenience of explanation, it may be assumed that the each of the plurality of second sub-data units SDU21, SDU22, . . . , SDU2t includes the second data bits DQ21~DQ28.

The random binary code RBC may include a plurality of code bits CB1, CB2, . . . , CBt corresponding to a number of each of the plurality of first sub-data units SDU11, SDU12, . . . , SDU1t and the plurality of second sub-data units SDU21, SDU22, . . . , SDU2t. Each of the plurality of code bits CB1, CB2, . . . , CBt may have one of a first logic level (i.e., a logic high level or "1") and a second logic level (i.e., a logic low level or "0") randomly.

Accordingly, the first data scrambler 410 in FIG. 7 may generate the second main data MD2 including the second sub-data units SDU21, SDU22, . . . , SDU2t by scrambling the first data bits DQ11~DQ18 of each of the first sub-data units SDU11, SDU12, . . . , SDU1t with a corresponding code bit of the plurality of code bits CB1, CB2, . . . , CBt. The second data scrambler 430 in FIG. 7 may generate the first main data MD1 including the first sub-data units SDU11, SDU12, . . . , SDU1t by scrambling the second data bits DQ21~DQ28 of each of the second sub-data units SDU21, SDU22, . . . , SDU2t with a corresponding code bit of the plurality of code bits CB1, CB2, . . . , CBt.

The first data scrambler 410 may generate the second data bits DQ21~DQ28 of the second sub-data unit SDU21 by scrambling each of the first data bits DQ11~DQ18 of the first sub-data unit SDU11 with the code bit CB1. In addition, the second data scrambler 430 may generate first data bits DQ11~DQ18 of the first sub-data unit SDU11 by scrambling each of the second data bits DQ21~DQ28 of the second sub-data unit SDU21 with the code bit SB1.

Figure 9A:
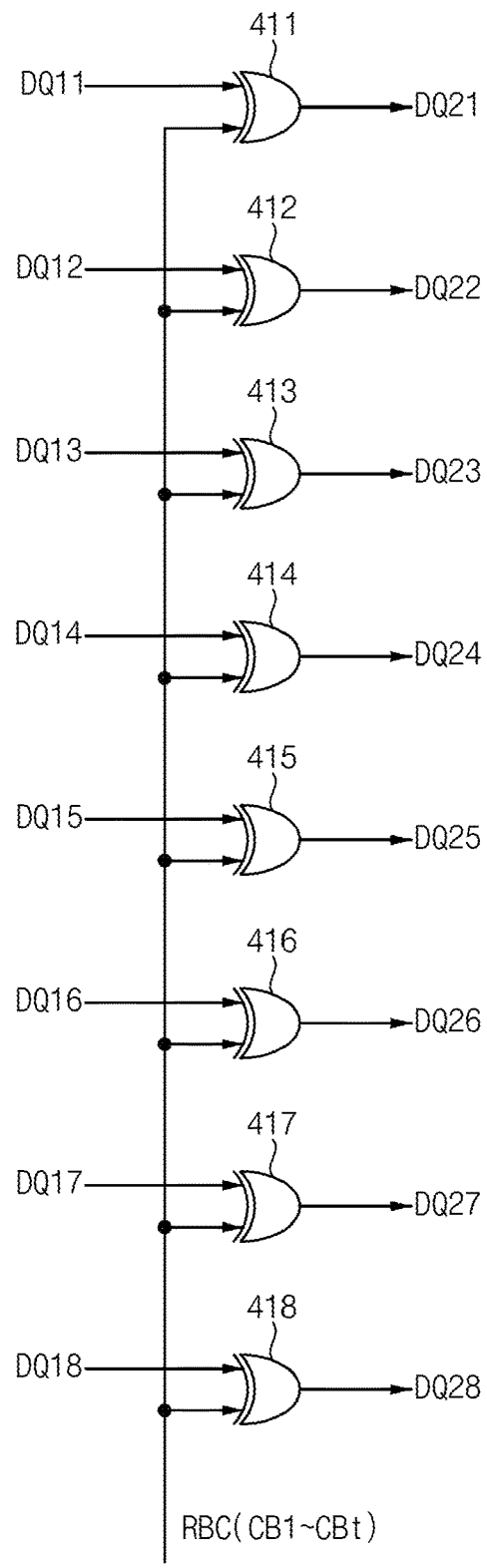
FIG. 9A is a circuit diagram illustrating an example of the first data scrambler in the on-die ECC engine of FIG. 7 according to example embodiments.

FIG. 9A is a circuit diagram illustrating an example of the first data scrambler 410 in the illustrative on-die ECC engine 400 of FIG. 7, according to example embodiments.

Referring to FIG. 9A, the first data scrambler 410 may include a plurality of XOR gates 411, 412, 413, 414, 415, 416, 417 and 418. Each of the plurality of XOR gates 411, 412, 413, 414, 415, 416, 417 and 418 may generate a corresponding one of the second data bits DQ21, DQ22, DQ23, DQ24, DQ25, DQ26, DQ27 and DQ28, respectively, of each of the second sub-data units SDU21, SDU22, . . . , SDU2t by performing an XOR operation on a respective one of the first data bits DQ11, DQ12, DQ13, DQ14, DQ15, DQ16, DQ17 and DQ18 of each of the first sub-data units SDU11, SDU12, . . . , SDU1t and a corresponding code bit of the plurality of code bits CB1, CB2, . . . , CBt of the random binary code RBC.

When the corresponding code bit of the plurality of code bits CB1, CB2, . . . , CBt has a first logic level, a corresponding one of the first data bits DQ11, DQ12, DQ13, DQ14, DQ15, DQ16, DQ17 and DQ18 is inverted and is provided as a corresponding one of the second data bits DQ21, DQ22, DQ23, DQ24, DQ25, DQ26, DQ27 and DQ28. When the corresponding code bit of the plurality of code bits CB1, CB2, . . . , CBt has a second logic level, a corresponding one of the first data bits DQ11, DQ12, DQ13, DQ14, DQ15, DQ16, DQ17 and DQ18 is maintained (i.e., is non-inverted) and is provided as a corresponding one of the second data bits DQ21, DQ22, DQ23, DQ24, DQ25, DQ26, DQ27 and DQ28.

Figure 9B:
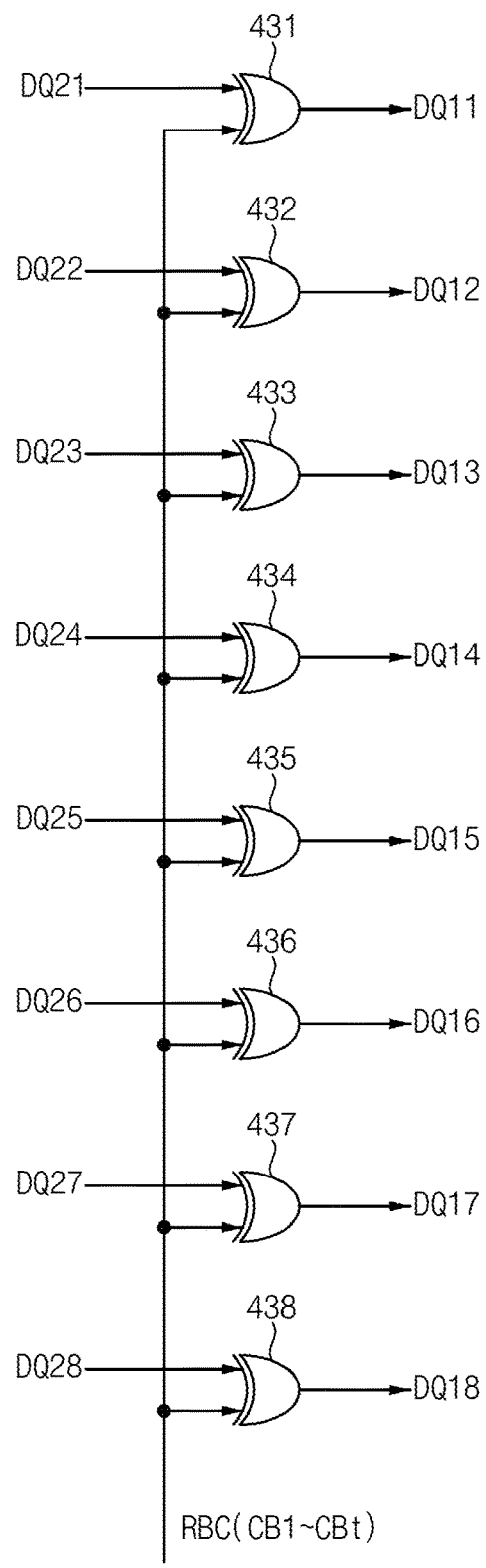
FIG. 9B is a circuit diagram illustrating an example of the second data scrambler in the on-die ECC engine of FIG. 7 according to example embodiments.

FIG. 9B is a circuit diagram illustrating an example of the second data scrambler 430 in the on-die ECC engine 400 of FIG. 7, according to example embodiments.

Referring to FIG. 9B, the second data scrambler 430, like the first data scrambler 410, may include a plurality of XOR gates 431, 432, 433, 434, 435, 436, 437 and 438. Each of the plurality of XOR gates 431, 432, 433, 434, 435, 436, 437 and 438 may generate a corresponding one of the first data bits DQ11, DQ12, DQ13, DQ14, DQ15, DQ16, DQ17 and DQ18, respectively, of each of the first sub-data units SDU11, SDU12, . . . , SDU1t by performing an XOR operation on respective one of the second data bits DQ21, DQ22, DQ23, DQ24, DQ25, DQ26, DQ27 and DQ28 of each of the second sub-data units SDU21, SDU22, . . . , SDU2t and a corresponding code bit of the plurality of code bits CB1, CB2, . . . , CBt of the random binary code RBC.

When the corresponding code bit of the plurality of code bits CB1, CB2, . . . , CBt has a first logic level, a corresponding one of the second data bits DQ21, DQ22, DQ23, DQ24, DQ25, DQ26, DQ27 and DQ28 is inverted and is provided as a corresponding one of the first data bits DQ11, DQ12, DQ13, DQ14, DQ15, DQ16, DQ17 and DQ18. When the corresponding code bit of the plurality of code bits CB1, CB2, . . . , CBt has a second logic level, a corresponding one of the second data bits DQ21, DQ22, DQ23, DQ24, DQ25, DQ26, DQ27 and DQ28 is maintained (i.e., is non-inverted) and is provided as a corresponding one of the first data bits DQ11, DQ12, DQ13, DQ14, DQ15, DQ16, DQ17 and DQ18.

Each of the second sub-data units SDU21, SDU22, . . . , SDU2t may be stored in a same sub-array block from among the plurality of sub-array blocks in the memory cell array 310 (see FIG. 5). Therefore, a same code bit (for example, the code bit CB1) may be applied to the first data bits DQ11, DQ12, DQ13, DQ14, DQ15, DQ16, DQ17 and DQ18 of the first sub-data unit SDU11 and to second data bits DQ21, DQ22, DQ23, DQ24, DQ25, DQ26, DQ27 and DQ28 of the second sub-data unit SDU21.

Figure 10:
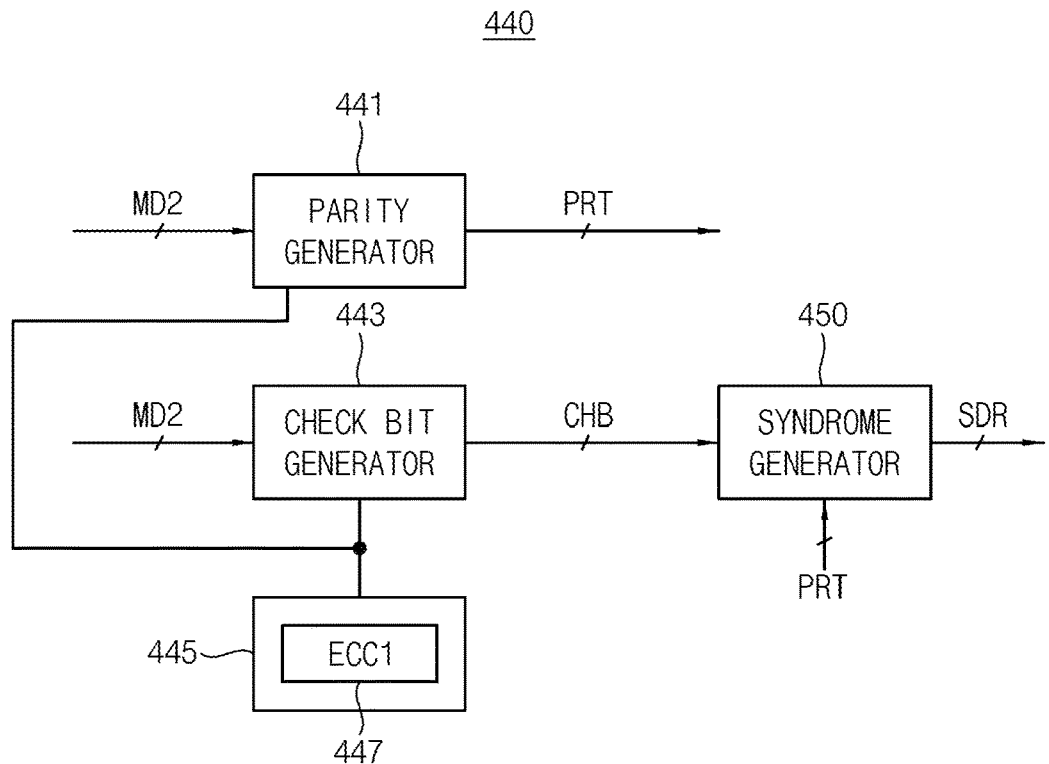
FIG. 10 illustrates an example of the encoding/decoding logic in the on-die ECC engine of FIG. 7 according to example embodiments.

FIG. 10 illustrates an example of the encoding/decoding logic 440 in the on-die ECC engine 400 of FIG. 7, according to example embodiments.

Referring to FIG. 10 the encoding/decoding logic 440 may include a parity generator 441, a check bit generator 443, a syndrome generator 450 and a memory 445. The memory 445 may store a first ECC (ECC1) 447.

The parity generator 441 may be connected to the memory 445 and may generate the parity data PRT based on the second main data MD2 using an array of exclusive OR gates.

The check bit generator 443 may be connected to the memory 445 and may generate check bits CHB based on the second main data MD2 using the first ECC 447 during the read operation.

The syndrome generator 450 may generate the syndrome data SDR based on the check bits CHB, based on the second main data MD2, and the parity data PRT from the buffer 494 (see FIG. 7) during the read operation. The syndrome generator 450 may generate the syndrome SDR based on whether each of the check bits CHB matches a corresponding one of the bits of the parity data PRT.

The syndrome SDR may include a plurality of syndrome bits and each of the plurality of syndrome bits may indicate whether each of the check bits CHB matches a corresponding one of the bits of the parity data PRT. Therefore, the syndrome SDR may indicate a position of the error bit and a number of the error bit.

Figure 11:
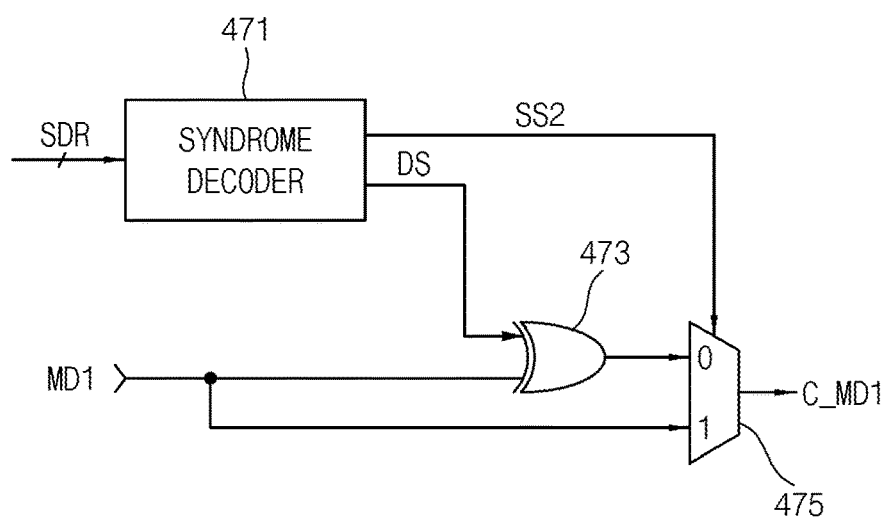
FIG. 11 illustrates an example of the data corrector in the on-die ECC engine of FIG. 7 according to example embodiments.

FIG. 11 illustrates an example of the data corrector 470 in the on-die ECC engine 400 of FIG. 7, according to example embodiments.

Referring to FIG. 11, the data corrector 470 may include a syndrome decoder 471, a bit inverter 473 and a selection circuit 475 which may be implemented by a multiplexer.

The syndrome decoder 471 may decode the syndrome SDR supplied thereto and generate a decoding signal DS and a second selection signal SS2. The decoding signal DS may indicate a position of the at least one error and the second selection signal SS2 may have a logic level indicative of a number of the at least one error bit. The bit inverter 473 may invert the at least one error bit in response to the decoding signal DS. The selection circuit 475 may select one of the first main data MD1 and an output of the bit inverter 473 to provide the corrected main data C_MD1 in response to the second selection signal SS2.

Figure 12:
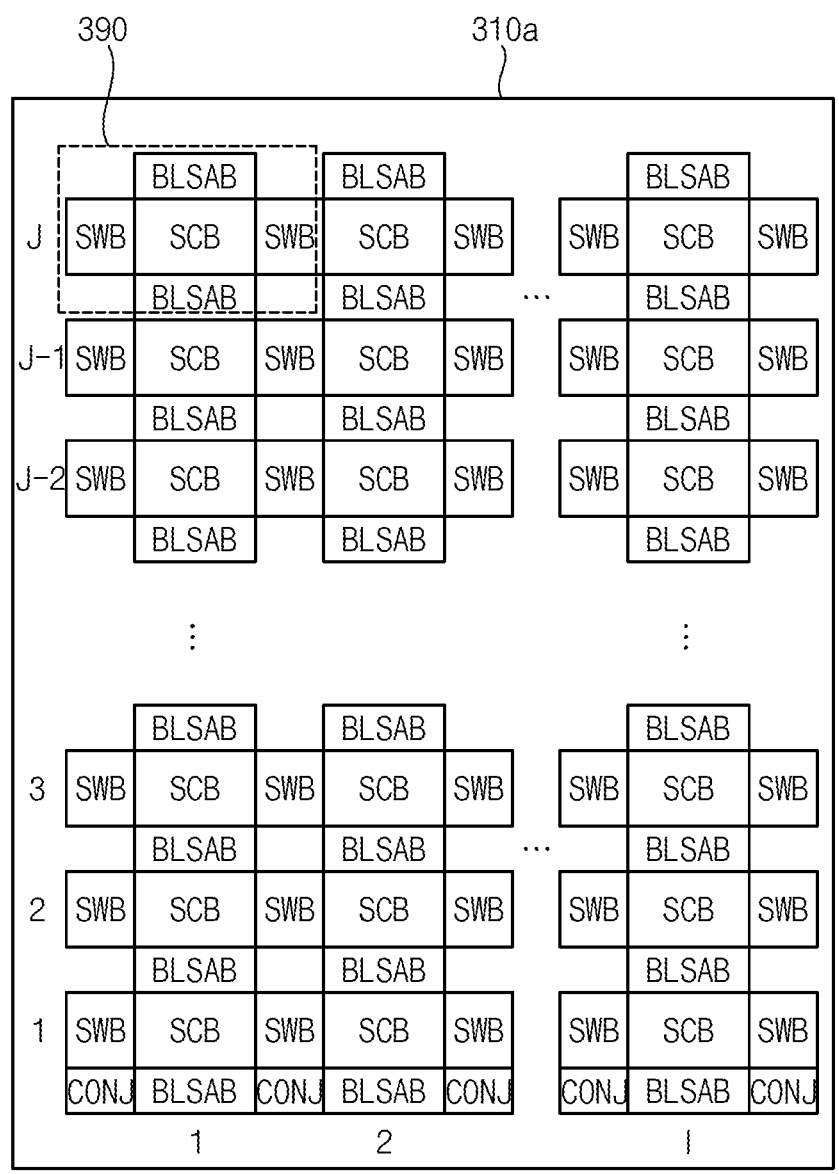
FIG. 12 illustrates an example of the first bank array in the semiconductor memory device of FIG. 5 according to example embodiments.
Figure 12:
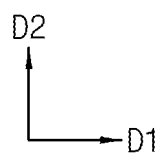

FIG. 12 illustrates an example of the first bank array 310a in the semiconductor memory device 200 of FIG. 5, according to example embodiments.

Referring to FIG. 12, in the first bank array 310a, I sub-array blocks SCB may be disposed in the first direction D1, and J sub-array blocks SCB may be disposed in the second direction D2 substantially perpendicular to the first direction D1. I and J represent a number of the sub-array blocks SCB in the first direction D1 and the second direction D2, respectively, and are natural numbers greater than two.

Embodiments of the inventive concept are not limited to any specific number for I and J, and furthermore I and J need not be the same number (although they can be).

A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ. A portion 390 in the first bank array 310a may be described in further detail with reference to FIG. 13 below.

Figure 13:
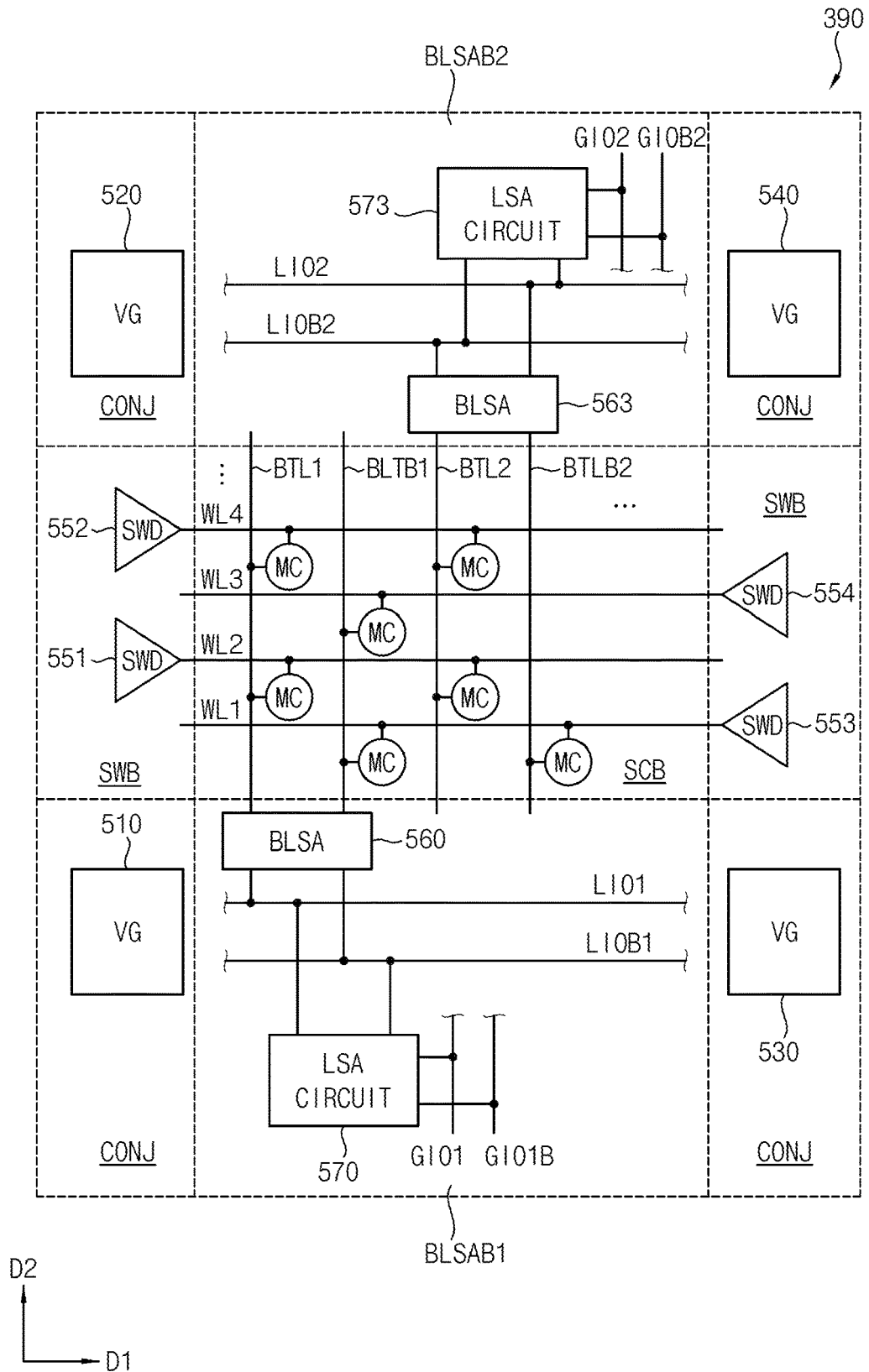
FIG. 13 illustrates a portion of the first bank array in FIG. 12 according to example embodiments.

FIG. 13 illustrates a portion 390 of the first bank array 310a in FIG. 12, according to example embodiments.

Referring to FIGS. 12 and 13, the portion 390 of the first bank array 310a includes the sub-array block SCB, two bit-line sense amplifier regions BLSAB1 and BLSAB2, two of the sub word-line driver regions SWB and four of the conjunction regions CONJ.

The sub-array block SCB includes a plurality of word-lines WL1~WL4, extending in the first direction D1, and a plurality of bit-line pairs BTL1~BTLB1 and BTL2~BTLB2, extending in the second direction D2. The direction D1 may be perpendicular to the direction D2. The sub-array block SCB includes a plurality of memory cells MCs disposed at intersections of the word-lines WL1~WL4 and the bit-line pairs BTL1~BTLB1 and BTL2~BTLB2.

With reference to FIG. 13, the sub word-line driver regions SWB include a plurality of sub word-line drivers SWDs 551, 552, 553 and 554 that respectively drive the word-lines WL1~WL4. The sub word-line drivers 551 and 552 may be disposed in the sub word-line driver region SWB, which is leftward (in this example), with respect to the sub-array block SCB. In addition, the sub word-line drivers 553 and 554 may be disposed in the sub word-line driver region SWB, which is rightward (in this example), with respect to the sub-array block SCB.

The bit-line sense amplifier regions BLSAB1 and BLSAB2 include a bit-line sense amplifier BLSA 560 and a bit-line sense amplifier 563, respectively, coupled to corresponding bit-line pairs BTL1~BTLB1 and BTL2~BTLB2, and respective local sense amplifier (LSA) circuits 570 and 573. The bit-line sense amplifier 560 may sense and amplify a voltage difference between the bit-line pair BTL1 and BTLB1 to provide an amplified voltage difference to a local I/O line pair LIO1 and LIOB1. The bit-line sense amplifier 563 may sense and amplify a voltage difference between the bit-line pair BTL2 and BTLB2 to provide the amplified voltage difference to a local I/O line pair LIO2 and LIOB2.

The local sense amplifier circuit 570 may control connection between the local I/O line pair LIO1 and LIOB1 and a global I/O line pair GIO1 and GIOB1. Similarly, the local sense amplifier circuit 573 may control connection between the local I/O line pair LIO2 and LIOB2 and a global I/O line pair GIO2 and GIOB2.

As illustrated in FIG. 13, the bit-line sense amplifier 560 and the bit-line sense amplifier 563 may be alternately disposed at an upper portion and a lower portion of the sub-array block SCB. The conjunction regions CONJ are disposed adjacent to the bit-line sense amplifier regions BLSAB1 and BLSAB2 and the sub word-line driver regions SWB. The conjunction regions CONJ are also disposed at each corner of the sub-array block SCB in FIG. 13. A plurality of voltage generators (VG)s 510, 520, 530 and 540 may be disposed in the conjunction regions CONJ. It is to be appreciated that the locations of the bit-line sense amplifiers 560, 563 and the conjunction regions CONJ shown in FIG. 13 are merely illustrative, and that other arrangements are similarly contemplated in accordance with embodiments of the inventive concept.

Figure 14:
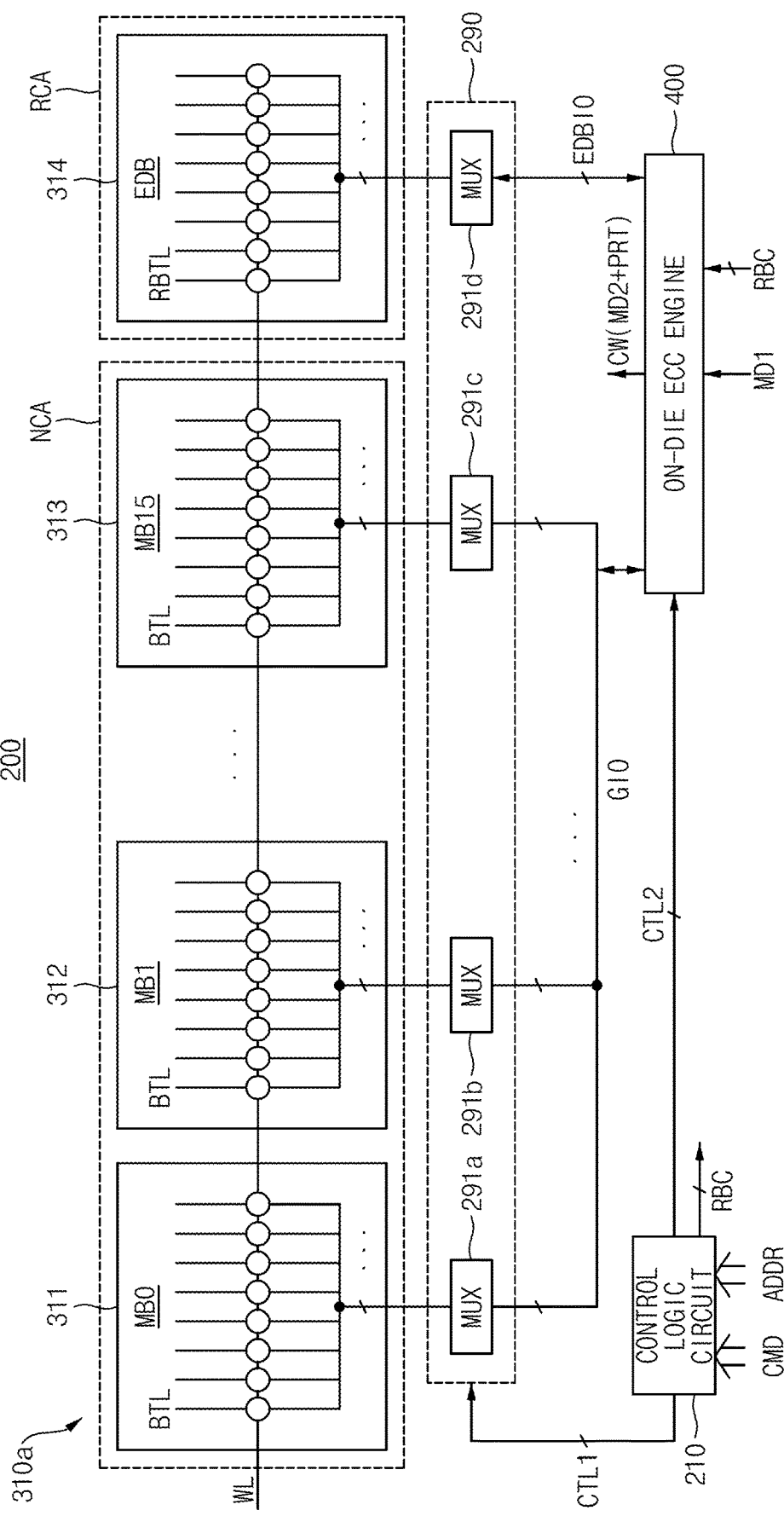
FIG. 14 illustrates a portion of the semiconductor memory device of FIG. 5 for explaining a write operation of a normal mode.

FIG. 14 illustrates a portion of the semiconductor memory device 200 of FIG. 5 for explaining a write operation of a normal mode, according to one or more embodiments.

In FIG. 14, the control logic circuit 210, the first bank array 310a, the I/O gating circuit 290 and the on-die ECC engine 400 are illustrated.

Referring to FIG. 14, the first bank array 310a includes a normal cell region NCA and a redundancy cell region RCA.

The normal cell region NCA includes a plurality of first memory blocks MB0~MB15, i.e., 311~313, and the redundancy cell region RCA includes at least a second memory block 314. The first memory blocks 311~313 may be memory blocks that determine or are used to determine a memory capacity of the semiconductor memory device 200. The second memory block 314 may be configured for ECC and/or redundancy repair. Since the second memory block 314 for ECC and/or redundancy repair is used for ECC, data line repair and block repair to repair "failed" cells generated in the first memory blocks 311~313, the second memory block 314 is also referred to as an EDB block. Each of the first memory blocks 311~313 includes memory cells coupled to a word-line WL and bit-lines BTL and the second memory block 314 includes memory cells coupled to word-line WL and redundancy bit-lines RBTL. The redundancy cell region RCA may be referred to as a parity cell region.

The I/O gating circuit 290 includes a plurality of switching circuits 291a~291d respectively connected to the first memory blocks 311~313 and the second memory block 314. Each of at least a subset of the switching circuits 291a~291d may be implemented using a multiplexer (MUX), as shown.

The on-die ECC engine 400 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the on-die ECC engine 400. In addition, the control logic circuit 210 may provide the random binary code RBC to the on-die ECC engine 400.

When the command CMD is a write command, the control logic circuit 210 provides the second control signal CTL2 to the on-die ECC engine 400. The on-die ECC engine 400 generates the second main data MD2 by scrambling the first main data MD1 with the random binary code RBC in response to the second control signal CTL2, generates the parity data PRT by performing an ECC encoding on the second main data MD2 and provides the I/O gating circuit 290 with the codeword CW including the second main data MD2 and the parity data PRT.

The control logic circuit 210 provides the first control signal CTL1 to the I/O gating circuit 290 such that the codeword CW is to be stored in a sub-page of the target page in the first bank array 310a.

Figure 15:
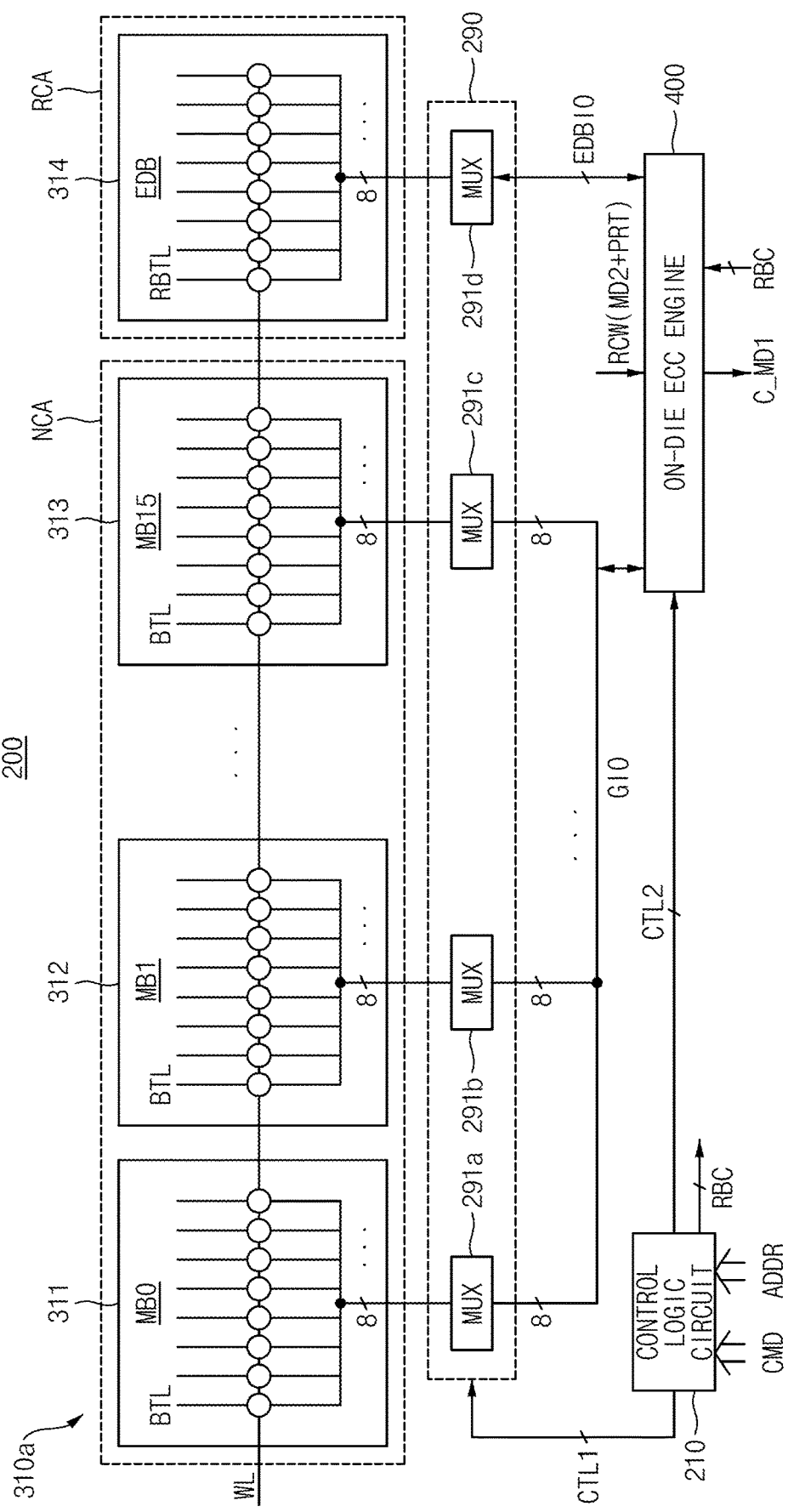
FIG. 15 illustrates a portion of the semiconductor memory device of FIG. 5 for explaining a read operation.

FIG. 15 illustrates a portion of the semiconductor memory device 200 of FIG. 5 for explaining a read operation. Description repeated with FIG. 14 will be omitted.

Referring to FIG. 15, when the command CMD is a read command to designate a read operation, the control logic circuit 210 provides the first control signal CTL1 to the I/O gating circuit 290 such that a (read) codeword RCW, which includes the second main data MD2 and the parity data PRT, stored in the sub-page of the target page in the first bank array 310a is provided to the on-die ECC engine 400.

The on-die ECC engine 400 performs an ECC decoding on the second main data MD2 based on the parity data PRT in parallel with generating the first main data MD1 by scrambling the second main data MD2 with the random binary code RBC, and corrects at least one error bit (if present) in the first main data MD1 to output the corrected main data C_MD1.

Figure 16:
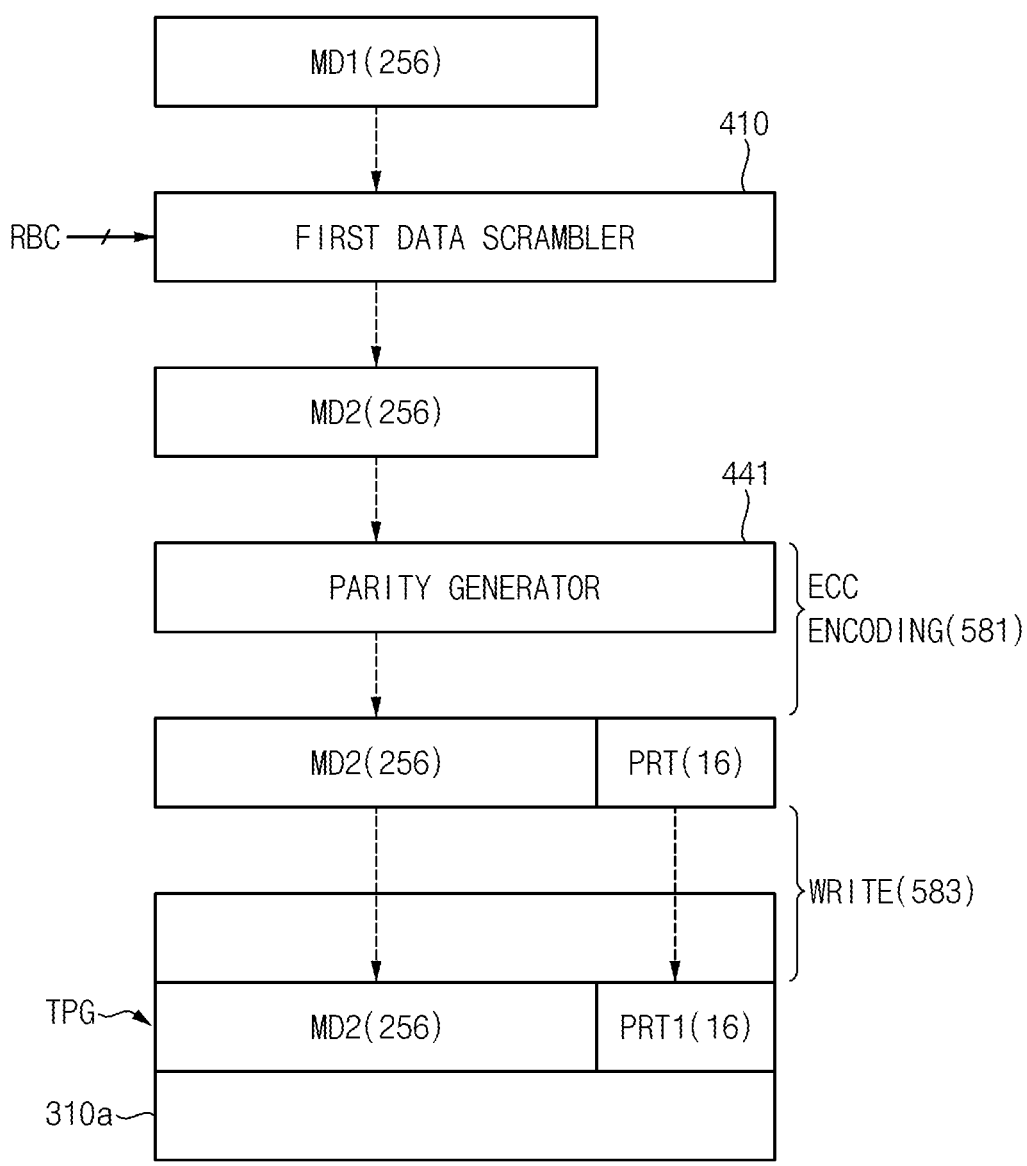
FIG. 16 illustrates that the semiconductor memory device of FIG. 5 performs a write operation.

FIG. 16 illustrates that the semiconductor memory device of FIG. 5 performs a write operation.

Referring to FIGS. 5, 7, 11 and 16, when the command CMD is a write command, the first data scrambler 410 generates the second main data MD2 by scrambling the first main data MD1 with the random binary code RBC, the parity generator 441 generates the parity data PRT by performing an ECC encoding on the second main data MD2, as a reference numeral 581 indicates, and the I/O gating circuit 290 stores the second main data MD2 and the parity data PRT in a target page TPG of the first bank array 310a, as a reference numeral 583 indicates. For example, each of the first main data MD1 and the second main data MD2 may include 256-bit data bits and the parity data PRT may include 16-bit parity bits.

Figure 17:
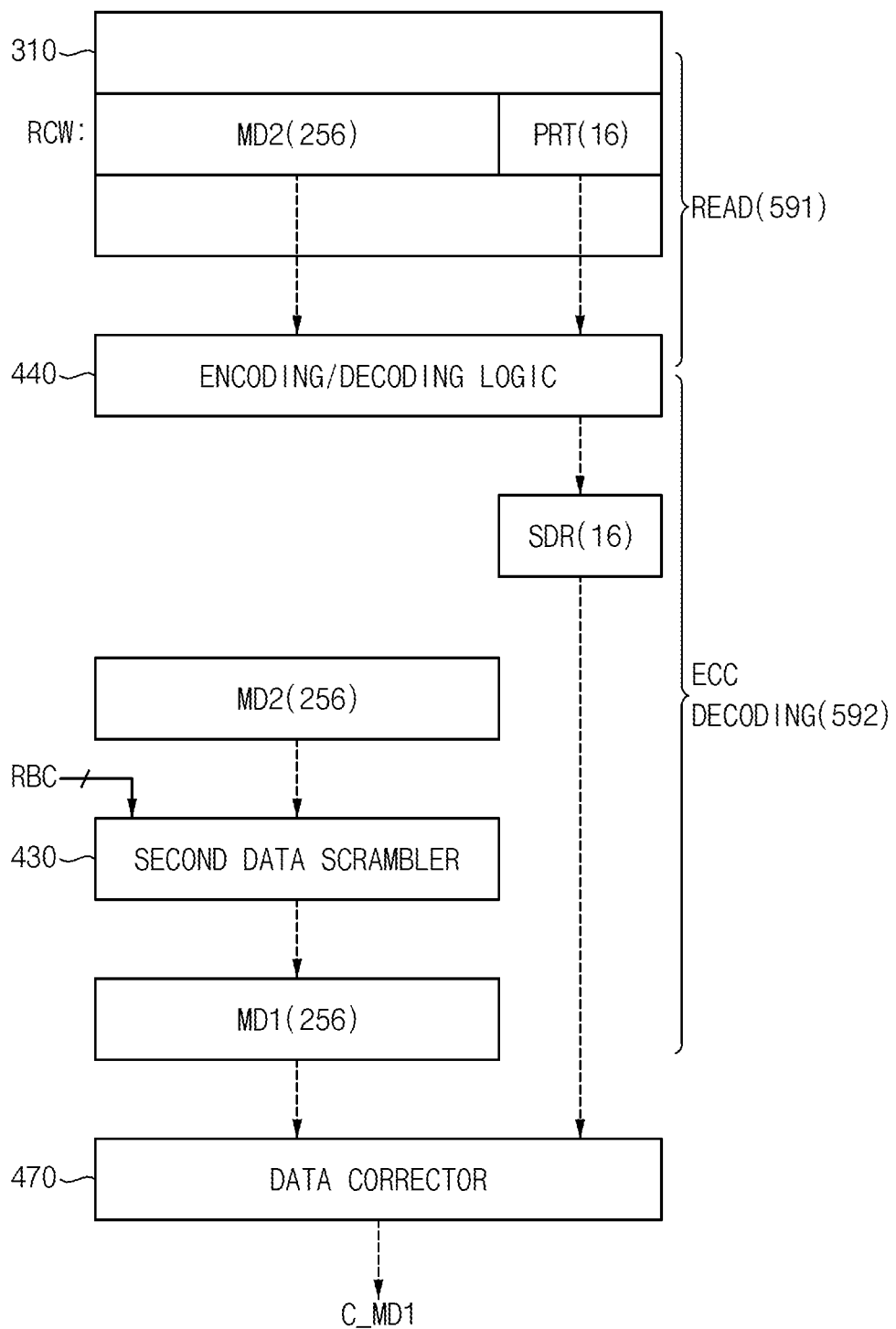
FIG. 17 illustrates that the semiconductor memory device of FIG. 5 performs a write operation.

FIG. 17 illustrates at least a portion of an exemplary write operation performed by the semiconductor memory device 200 of FIG. 5, according to one or more embodiments.

Referring to FIGS. 3, 7 and 17, when the command CMD is a write command, the encoding/decoding logic 440 receives the codeword RCW, which may include the second main data MD2 and the parity data PRT read from the target page TPG of the first bank array 310a as a reference numeral 591 indicates, generates the first main data MD1 by scrambling (e.g., using the second data scrambler 430) the second main data MD2 with the random binary code RBC in parallel with generating the syndrome SDR by performing an ECC decoding on the second main data MD2 based on the parity data PRT and by providing the syndrome SDR to the data corrector 470, as a reference numeral 592 indicates, and provides the first main data MD1 to the data corrector 470. For example, the syndrome SDR may include 16-bit of syndrome bits.

The data corrector 470 corrects at least one error bit in the first main data MD1 (if present) based on the syndrome to output the corrected main data C_MD1.

Figure 18:
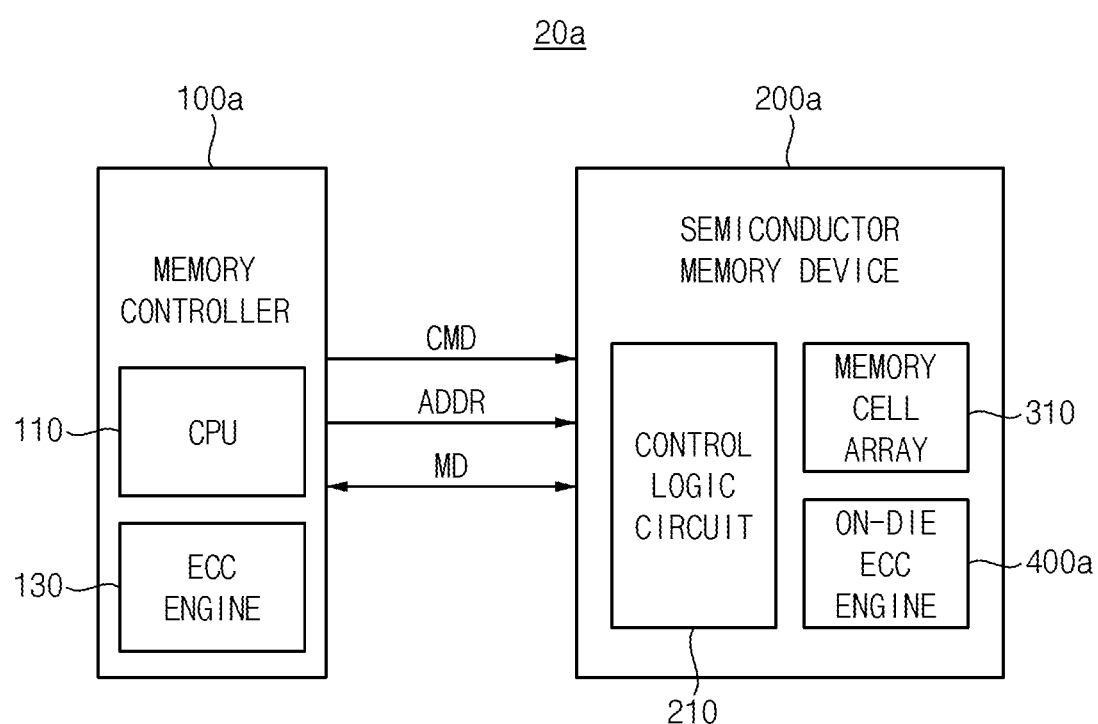
FIG. 18 is a block diagram illustrating an example of a memory system according to example embodiments.

FIG. 18 is a block diagram illustrating at least a portion of an example of a memory system 20a, according to example embodiments.

Referring to FIG. 18, the memory system 20a may include a memory controller 100a and a semiconductor memory device 200a.

The memory controller 100a transmits a command CMD, and an address (signal) ADDR to the semiconductor memory device 200a and exchanges a main data MD with the semiconductor memory device 200a.

The memory controller 100a may include a CPU 110 and an ECC engine 130.

The CPU 110 may control overall operation of the memory controller 100 and may generate the main data without scrambling user data.

The ECC engine 130 may correct error bits in the main data MD received from the semiconductor memory device 200a.

The semiconductor memory device 200a includes a memory cell array 310 that stores a scrambled main data corresponding to the main data MD, an on-die ECC engine 400a and a control logic circuit 210. The memory cell array 310 may include a plurality of sub-array blocks arranged in a first direction and a second direction, the second direction intersecting with the first direction (e.g., the second direction may be orthogonal to the first direction); for example, consistent with the illustrative arrangement of the first bank array 310a shown in FIG. 6.

The on-die ECC engine 400a, during a write operation, may generate the scrambled main data by scrambling the main data MD with a random binary code received from the control logic circuit 210, may perform an ECC encoding on the scrambled main data to generate a parity data and may store the scrambled main data and the parity data in a target page in the memory cell array 310.

The on-die ECC engine 400a, during a read operation, may read the scrambled main data and the parity data from the target page, perform an ECC decoding on the scrambled main data based on the parity data to generate a syndrome in parallel with generating the main data MD by scrambling the scrambled main data with random binary code, may correct at least one error bit in the main data MD based on the syndrome and may transmit the corrected main data to the memory controller 100a.

Each of the main data MD and the scrambled main data may include a plurality of data bits, and the plurality of data bits may be divided into a plurality of sub-data units. The main data MD may include a plurality of first sub-data units and the scrambled main data may include a plurality of second sub-data units.

Figure 19:
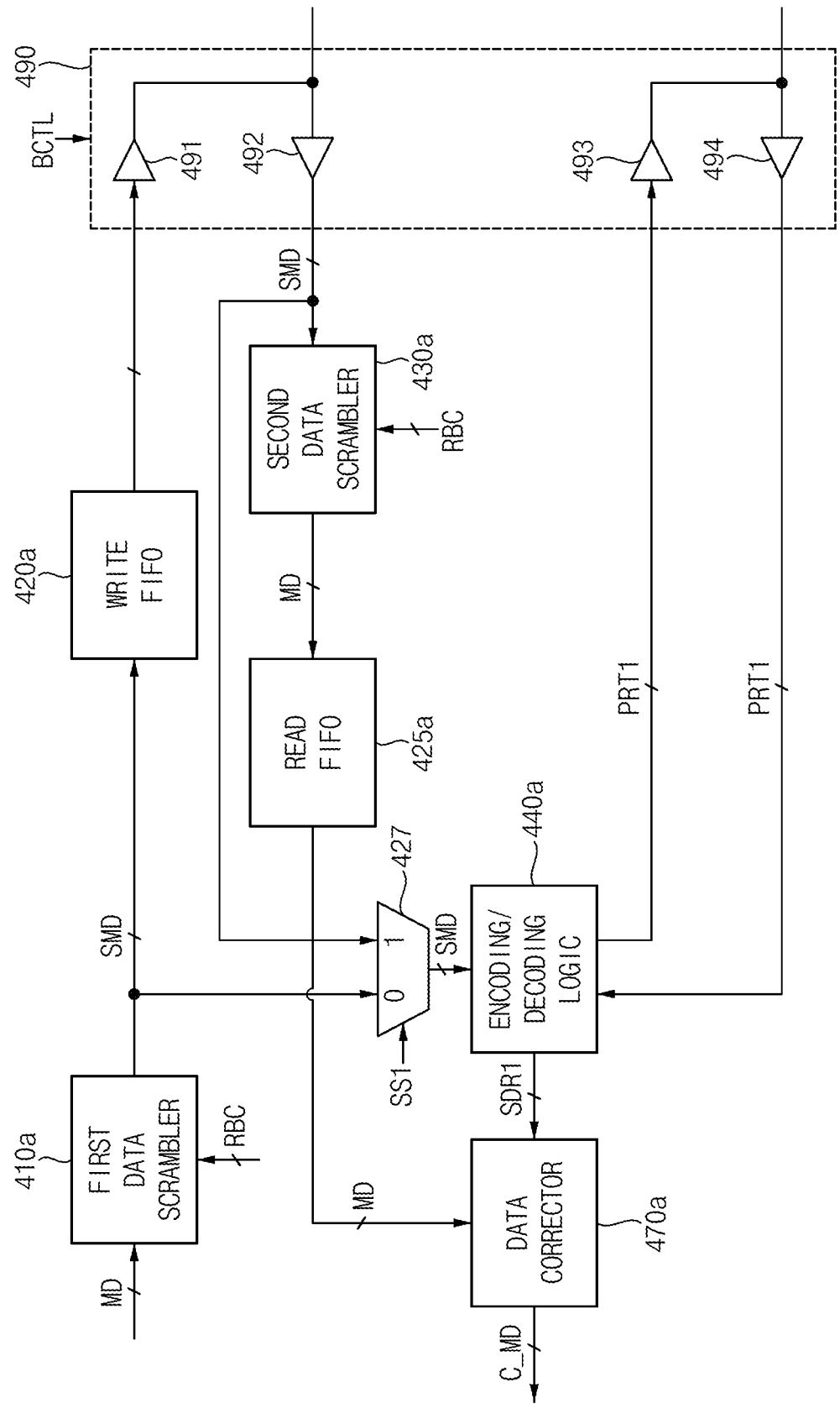
FIG. 19 is a block diagram illustrating an example of the on-die ECC engine in the memory system of FIG. 18 according to example embodiments.

FIG. 19 is a block diagram illustrating an example of the on-die ECC engine 400a in the memory system of FIG. 18, according to example embodiments.

Referring to FIG. 19, the on-die ECC engine 400a may include a first data scrambler 410a, a write FIFO register 420a, a second data scrambler 430a, a read FIFO register 425a, a multiplexer 427, an encoding/decoding logic 440a, a data corrector 470a, and a buffer circuit 490.

The buffer circuit 490 may include buffers 491, 492, 493 and 494. The buffers 491, 492, 493 and 494 may be controlled by a buffer control signal BCTL. The buffers 491, 492, 493, 494 may be inverting or non-inverting buffers.

The first data scrambler 410a may generate a scrambled main data SMD by scrambling (i.e., encoding) the main data MD with the random binary code RBC during the write operation and may store the scrambled main data SMD in the write FIFO register 420a. The scrambled main data SMD stored in the write FIFO register 420a may be stored in the target page of the memory cell array 310 (see FIG. 18) through the buffer 491.

The multiplexer 427 may provide the encoding/decoding logic 440a with the second main data output MD2 from the first data scrambler 410a during the write operation and may provide the encoding/decoding logic 440a with the scrambled main data SMD read from the target page through the buffer 492, in response to a selection signal SS1.

The second data scrambler 430a may receive the scrambled main data SMD from the buffer 492, may generate the main data MD by scrambling (i.e., encoding) the scrambled main data SMD with the random binary code RBC, during the read operation, and may provide the main data MD for storage in the read FIFO register 425a. The read FIFO register 425a may provide the main data MD to the data corrector 470a.

The encoding/decoding logic 440a, during the write operation, may receive the scrambled main data SMD from the multiplexer 427, may generate a parity data PRT1 by performing an ECC encoding on the scrambled main data SMD, and may provide the parity data PRT1 to the target page of the memory cell array 310 (see FIG. 18) through the buffer 493. The encoding/decoding logic 440a, during the read operation, may receive the scrambled main data SMD from the multiplexer 427, may receive the parity data PRT1 from the buffer 494, may generate a syndrome SDR1 by performing an ECC decoding on the scrambled main data SMD and the parity data PRT1, and may provide the syndrome SDR1 to the data corrector 470a.

During the read operation, the encoding/decoding logic 440a may generate the syndrome SDR1 by performing the ECC decoding on the scrambled main data SMD and the parity data PRT1 and may provide the syndrome SDR1 to the data corrector 470a in parallel with the second data scrambler 430a generating the main data MD by scrambling the scrambled main data SMD with the random binary code RBC, and providing the main data MD for storage in the read FIFO register 425a.

The data corrector 470a, during the read operation, may receive the main data MD from the read FIFO register 425a and may output a corrected data C_MD by correcting at least one error bit in the main data MD (if present) based on the syndrome SDR1.

Figure 20:
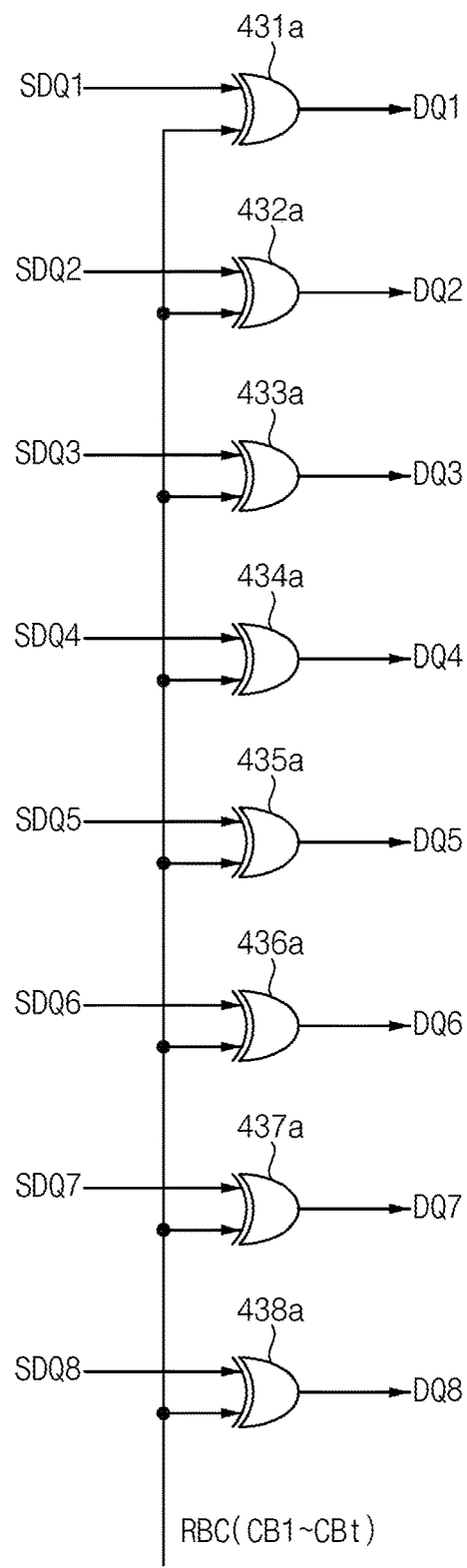
FIG. 20 is a circuit diagram illustrating an example of the second data scrambler in the on-die ECC engine of FIG. 19 according to example embodiments.

FIG. 20 is a circuit diagram illustrating an example of the second data scrambler 430a in the on-die ECC engine 440a of FIG. 19, according to example embodiments.

Referring to FIG. 20, the second data scrambler 430a may include a plurality of XOR gates 431a, 432a, 433a, 434a, 435a, 436a, 437a and 438a. Each of the plurality of XOR gates 431a, 432a, 433a, 434a, 435a, 436a, 437a and 438a may generate each of first data bits DQ1, DQ2, DQ3, DQ4, DQ5, DQ6, DQ7 and DQ8, respectively, of each of the first sub-data units of the main data MD by performing an XOR operation on respective one of second data bits SDQ1, SDQ2, SDQ3, SDQ4, SDQ5, SDQ6, SDQ7 and SDQ8 of each of the second sub-data units and a corresponding code bit of the plurality of code bits CB1, CB2, . . . , CBt of the random binary code RBC.

When the corresponding code bit of the plurality of code bits CB1, CB2, . . . , CBt has a first logic level, a corresponding one of the second data bits SDQ1, SDQ2, SDQ3, SDQ4, SDQ5, SDQ6, SDQ7 and SDQ8 is inverted and is provided as a corresponding one of the first data bits DQ1, DQ2, DQ3, DQ4, DQ5, DQ6, DQ7 and DQ8. When the corresponding code bit of the plurality of code bits CB1, CB2, . . . , CBt has a second logic level, a corresponding one of the second data bits SDQ1, SDQ2, SDQ3, SDQ4, SDQ5, SDQ6, SDQ7 and SDQ8 is maintained (i.e., is non-inverted) and is provided as a corresponding one of the first data bits DQ1, DQ2, DQ3, DQ4, DQ5, DQ6, DQ7 and DQ8.

Each of the second sub-data units of the scrambled main data SMD may be stored in a same sub-array block from among the plurality of sub-array blocks in the memory cell array 310 (see FIG. 18). Therefore, a same code bit (for example, the code bit CB1) may be applied to the first data bits DQ1, DQ2, DQ3, DQ4, DQ5, DQ6, DQ7 and DQ8 of the first sub-data unit and to the second data bits SDQ1, SDQ2, SDQ3, SDQ4, SDQ5, SDQ6, SDQ7 and SDQ8 of the second sub-data unit.

Figure 21:
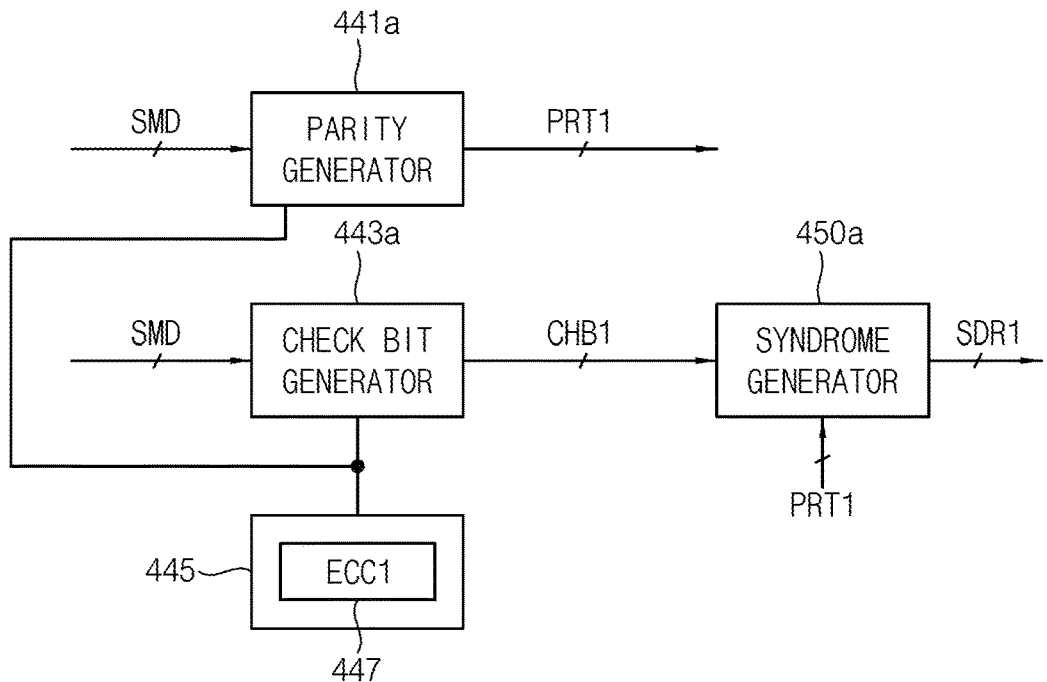
FIG. 21 illustrates an example of the encoding/decoding logic in the on-die ECC engine of FIG. 19 according to example embodiments.

FIG. 21 illustrates an example of the encoding/decoding logic 440a in the on-die ECC engine 400a of FIG. 19, according to example embodiments.

Referring to FIG. 21, the encoding/decoding logic 440a may include a parity generator 441a, a check bit generator 443a, a syndrome generator 450a and a memory 445. The memory 445 may store a first ECC (ECC1) 447.

The parity generator 441a may be connected to the memory 445 and may generate the parity data PRT1 based on the scrambled main data SMD using an array of exclusive OR gates.

The check bit generator 443a may be connected to the memory 445 and may generate check bits CHB1 based on the scrambled main data SMD using the first ECC 447 during the read operation.

The syndrome generator 450a may generate the syndrome data SDR1 based on the check bits CHB1, which is based on the scrambled main data SMD and the parity data PRT1 from the buffer 494 (see FIG. 19) during the read operation. The syndrome generator 450a may generate the syndrome SDR1 based on whether each of the check bits CHB1 matches a corresponding one of the bits of the parity data PRT1.

The syndrome SDR1 may include a plurality of syndrome bits and each of the plurality of syndrome bits may indicate whether each of the check bits CHB1 matches a corresponding one of the bits of the parity data PRT1. Therefore, the syndrome SDR1 may indicate a position of the error bit and a number of the error bit.

Figure 22:
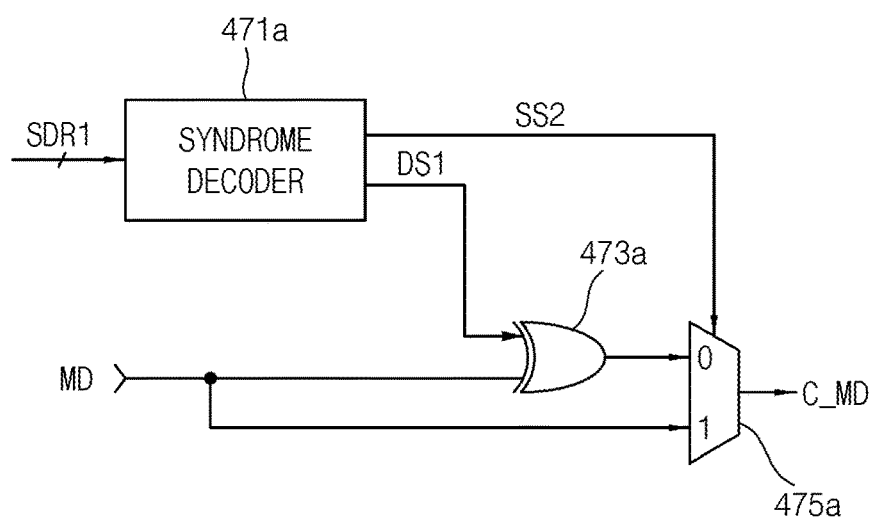
FIG. 22 illustrates an example of the data corrector in the on-die ECC engine of FIG. 19 according to example embodiments.

FIG. 22 illustrates an example of the data corrector 470a in the on-die ECC engine 400a of FIG. 19, according to example embodiments.

Referring to FIG. 22, the data corrector 470a may include a syndrome decoder 471a, a bit inverter 473a, which may be implemented using an XOR gate, and a selection circuit 475a, which may be implemented by a multiplexer.

The syndrome decoder 471a may decode the syndrome SDR1 to generate a decoding signal DS1 and a second selection signal SS2. The decoding signal DS1 may indicate a position of the at least one error bit and the second selection signal SS2 may have a logic level depending on a number of the at least one error bit. The bit inverter 473a may invert the at least one error bit in response to the decoding signal DS1. The selection circuit 475a may select one of the main data MD and an output of the bit inverter 473a to provide the corrected main data C_MD in response to the second selection signal SS2.

Figure 23:
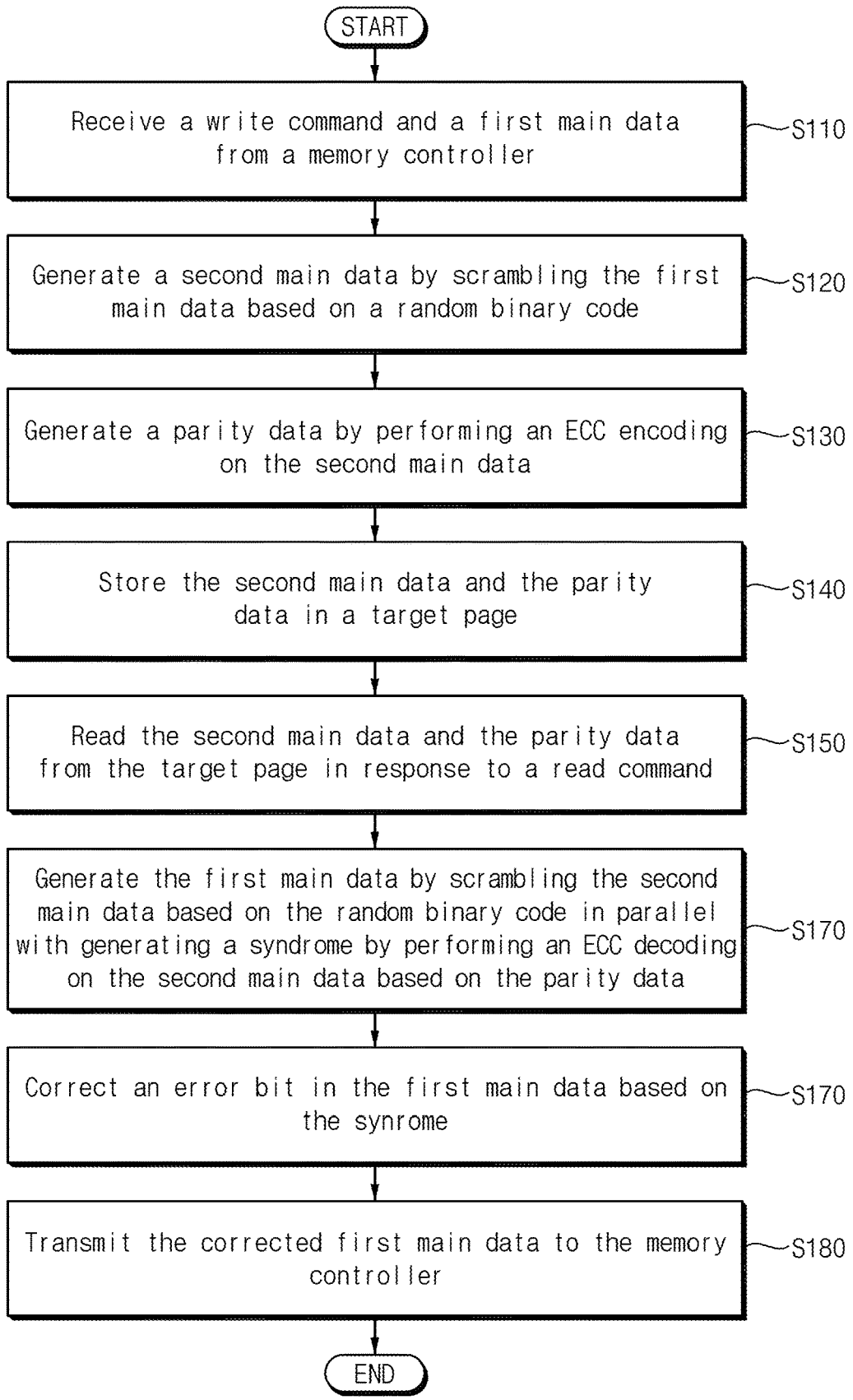
FIG. 23 is a flow chart illustrating a method of operating a semiconductor memory device according to example embodiments.

FIG. 23 is a flow chart illustrating at least a portion of an example method of operating a semiconductor memory device, according to example embodiments.

Referring to FIGS. 1 through 17 and 23, in a method of operating a semiconductor memory device 200 that includes a memory cell array 310, an on-die ECC engine 400 and a control logic circuit 210, the semiconductor memory device 200 may receive a write command and a first main data MD1 from a memory controller 100 (operation S110).

A first data scrambler 410 in the on-die ECC engine 400 may generate a second main data MD2 by scrambling (i.e., encoding) the first main data MD1 based on a random binary code RBC (operation S120).

An encoding/decoding logic 440 in the on-die ECC engine 400 may generate a parity data PRT by performing an ECC encoding on the second main data MD2 (operation S130).

An I/O gating circuit 290 may store the second main data MD2 and the parity data PRT in a target page of the memory cell array 310 (operation S140).

The on-die ECC engine 400 may read the second main data MD2 and the parity data PRT from the target page of the memory cell array 310 in response to a read command from the memory controller 100 (operation S150).

The encoding/decoding logic 440 in the on-die ECC engine 400 generates the first main data MD1 by scrambling the second main data MD2 with the random binary code RBC in parallel with generating a syndrome SDR by performing an ECC decoding on the second main data MD2 based on the parity data PRT (operation S160).

A data corrector 470 in the on-die ECC engine 400 corrects at least one error bit in the first main data MD1 based on the syndrome SDR (operation S170).

The data I/O buffer 295 transmits the corrected first main data C_MD1 to the memory controller 100 (operation S180).

Therefore, in the semiconductor memory device and the method of operating the semiconductor memory device, the on-die ECC engine may generate the first main data by scrambling the second main data with the random binary code in parallel with generating a syndrome by performing an ECC decoding on the second main data read from the memory cell array and may correct at least one error bit in the first main data based on the syndrome. Because the on-die ECC engine does not perform data scrambling after performing the ECC decoding, the data scrambling does not need extra time. Therefore, the on-die ECC engine may reduce latency associated with the read operation while reducing pattern noise that occurs when fixed data patterns are repeated and may reduce a size of logic associated with the data scrambling.

Figure 24:
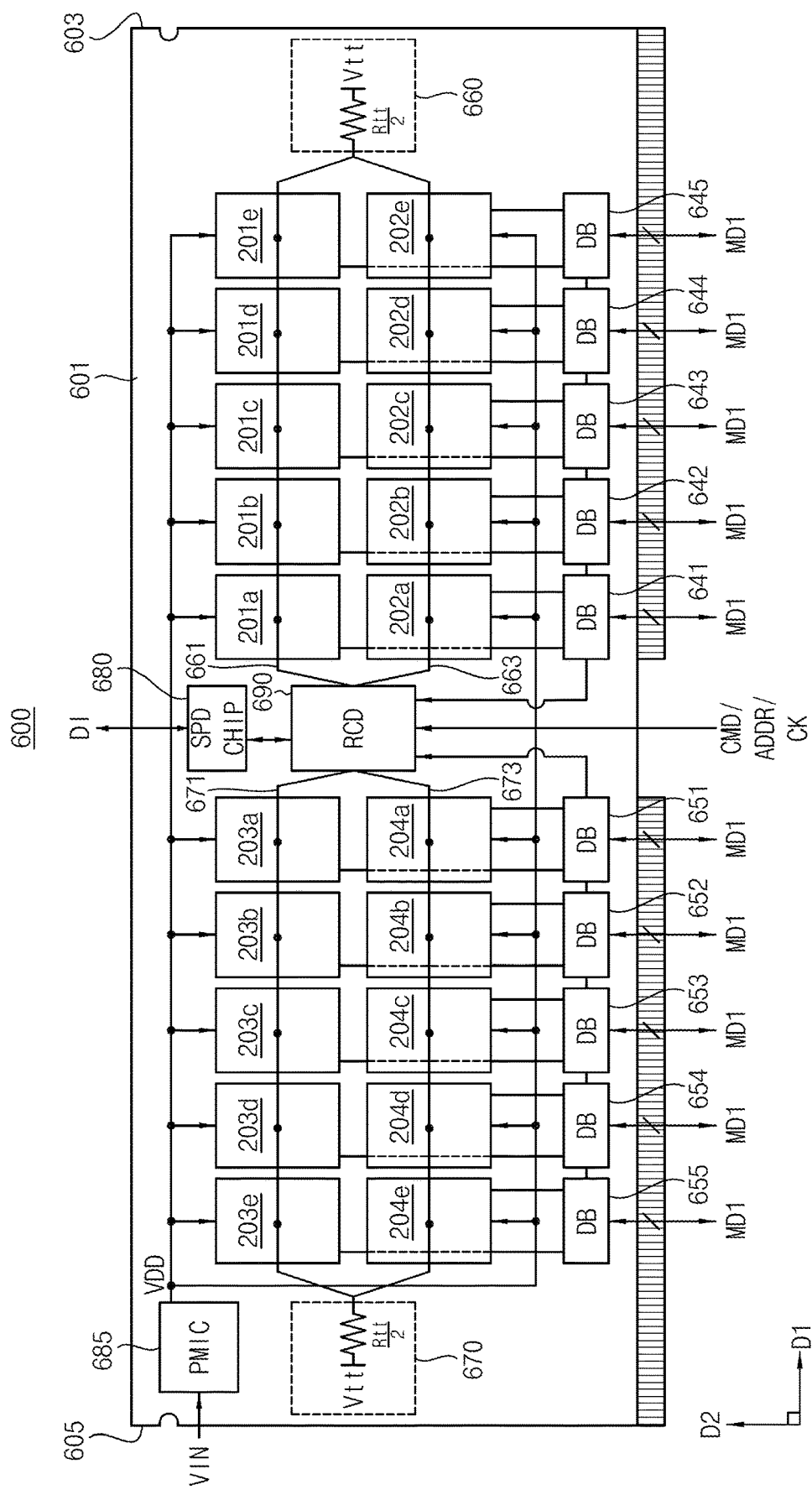
FIG. 24 is a block diagram illustrating an example of memory module according to example embodiments.

FIG. 24 is a block diagram illustrating at least a portion of an example of memory module 600, according to example embodiments.

Referring to FIG. 24, the memory module 600 includes a register clock driver (RCD) 690 disposed (or mounted) in a circuit board 601, a plurality of semiconductor memory devices 201a~201e, 202a~202e, 203a~203e, and 204a~204e, a plurality of data buffers 641645 and 651655, module resistance units 660 and 670, a serial presence detection (SPD) chip 680, and a power management integrated circuit (PMIC) 685.

By way of example only and without limitation, the circuit board 601 which is a printed circuit board may extend in a first direction D1, perpendicular to a second direction D2, between a first edge portion (e.g., right side) 603 and a second edge portion (e.g., left side) 605. The first edge portion 603 and the second edge portion 605 may extend in the second direction D2.

The RCD 690 may be disposed on a center of the circuit board 601. The plurality of semiconductor memory devices 201a~201e, 202a~202e, 203a~203e, and 204a~204e may be arranged in a plurality of rows between the RCD 690 and the first edge portion 603 and between the RCD 690 and the second edge portion 605.

In this case, the semiconductor memory devices 201a~201e and 202a~202e may be arranged along a plurality of rows between the RCD 690 and the first edge portion 603. The semiconductor memory devices 203a~203e, and 204a~204e may be arranged along a plurality of rows between the RCD 690 and the second edge portion 605. A portion of the semiconductor memory devices 201a~201e and 202a~202e may be an ECC memory device. The ECC memory device may perform an ECC encoding operation to generate parity bits about data to be written at memory cells of the plurality of semiconductor memory devices 201a~201e, 202a~202e, 203a~203e, and 204a~204e, and an ECC decoding operation to correct an error that may be present in the data read from the memory cells.

Each of the plurality of semiconductor memory devices 201a~201e, 202a~202e, 203a~203e, and 204a~204e may be coupled to a corresponding one of the data buffers 641645 and 651655 through a data transmission line for receiving/transmitting a first main data MD1.

Each of the plurality of semiconductor memory devices 201a~201e, 202a~202e, 203a~203e, and 204a~204e may employ the semiconductor memory device 200 of FIG. 5. Therefore, each of the plurality of semiconductor memory devices 201a~201e, 202a~202e, 203a~203e, and 204a~204e includes a memory cell array, a control logic circuit and an on-die ECC engine. The on-die ECC engine may include a first data scrambler and a second data scrambler.

The RCD 690 may provide a command/address signal (e.g., CA) to the semiconductor memory devices 201a~201e through a command/address transmission line 661 and may provide a command/address signal to the semiconductor memory devices 202a~202e through a command/address transmission line 663. In addition, the RCD 690 may provide a command/address signal to the semiconductor memory devices 203a~203e through a command/address transmission line 671 and may provide a command/address signal to the semiconductor memory devices 204a~204e through a command/address transmission line 673.

The command/address transmission lines 661 and 663 may be connected in common to the module resistance unit 660 adjacent to the first edge portion 603, and the command/address transmission lines 671 and 673 may be connected in common to the module resistance unit 670 adjacent to the second edge portion 605. Each of the module resistance units 660 and 670 may include a termination resistor Rtt/2 connected to a termination voltage Vtt. In this case, an arrangement of the module resistance units 660 and 670 may reduce the number of the module resistance units, thus reducing an area where termination resistors are disposed.

The SPD chip 680 may be adjacent to the RCD 690 and the PMIC 685 may be disposed between the semiconductor memory device 203e and the second edge portion 605. The PMIC 685 may generate a power supply voltage VDD based on the input voltage VIN and may provide the power supply voltage VDD to the semiconductor memory devices 201a~201e, 202a~202e, 203a~203e, and 204a~204e.

The RCD 690 may control the semiconductor memory devices 201a~201e, 202a~202e, 203a~203e, and 204a~204e and the PMIC 685 under control of the memory controller 100 (see FIG. 3). The RCD 690 may receive an address ADDR, a command CMD, and a clock signal CK from the memory controller 100 (see FIG. 3).

The SPD chip 680 may be a programmable read only memory (e.g., EEPROM). The SPD chip 680 may include device information DI of the memory module 600. In example embodiments, the SPD chip 680 may include the device information DI, which may comprise information relating to, for example, a module form, a module configuration, a storage capacity, a module type, an execution environment, or the like of the memory module 600.

When a memory system including the memory module 600 is booted up, a host may read the device information DI from the SPD chip 680 and may recognize the memory module 600 based on the device information DI. The host may control the memory module 600 based on the device information DI from the SPD chip 680. For example, the host may recognize a type of the semiconductor memory devices 201a~201e, 202a~202e, 203a~203e, and 204a~204e included in the memory module 600 based on the device information DI from the SPD chip 680.

In example embodiments, the SPD chip 680 may communicate with the host through a serial bus. For example, the host may exchange a signal with the SPD chip 680 through the serial bus. The SPD chip 680 may also communicate with the RCD 690 through the serial bus.

Figure 25:
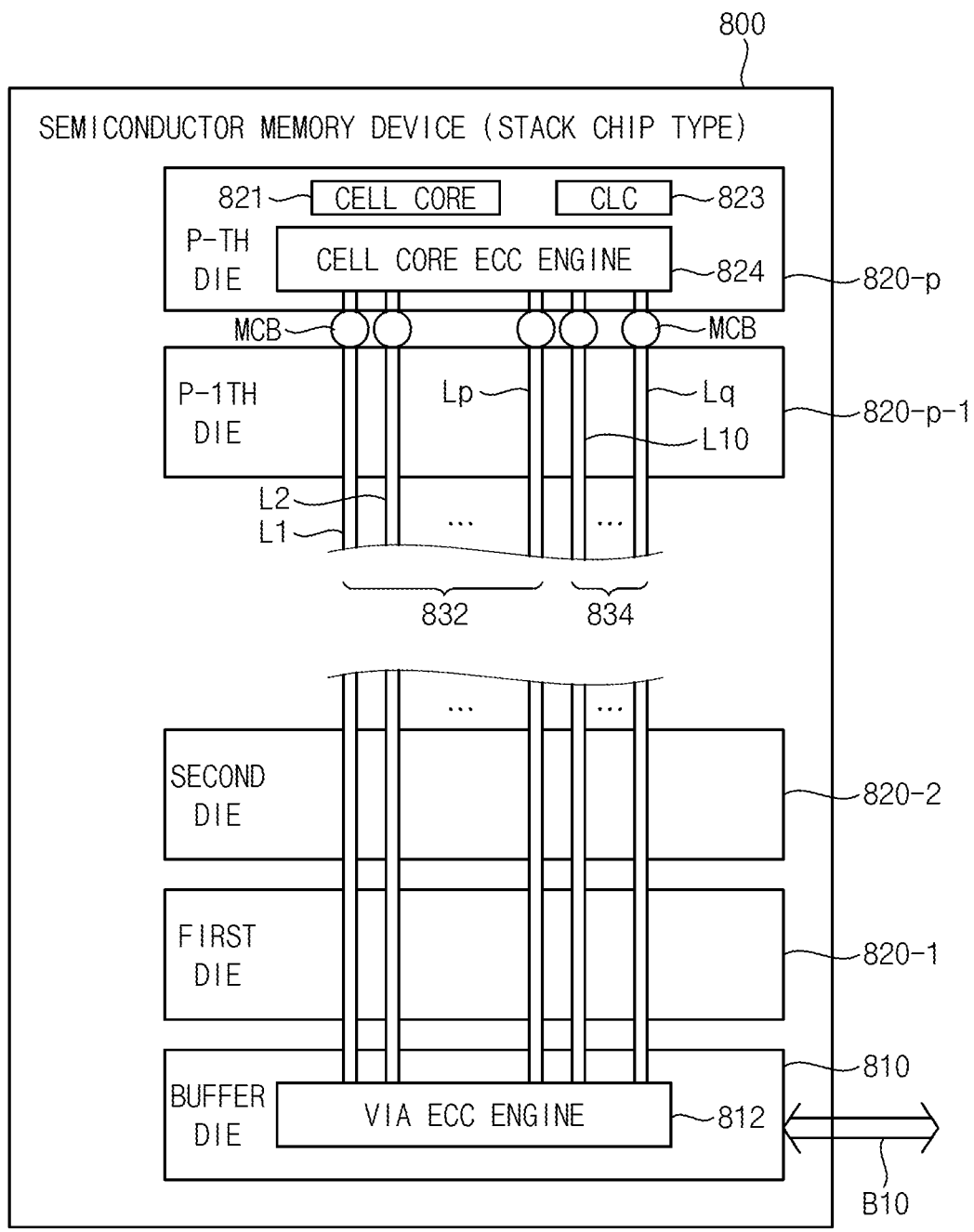
FIG. 25 is a block diagram illustrating a semiconductor memory device according to example embodiments.

FIG. 25 is a block diagram illustrating at least a portion of an example semiconductor memory device 800, according to example embodiments.

Referring to FIG. 25, the semiconductor memory device 800 may include at least one buffer die 810 and a plurality of memory dies 820-1 to **820-*p* providing a soft error analyzing and correcting function in a stacked chip structure. Here, p is an integer greater than three. It is to be appreciated that embodiments of the inventive concept are not limited to any specific number of memory dies in the semiconductor memory device 800**.

The plurality of memory dies 820-1 to **820-*p* may be stacked on the at least one buffer die 810** and convey data through a plurality of through silicon via (TSV) lines.

Each of the memory dies 820-1 to **820-*p* may include a cell core 821 including a plurality of memory cells, a cell core ECC engine 824 which generates transmission parity data based on transmission data to be sent to the at least one buffer die 810, and a control logic circuit (CLC) 823. The cell core ECC engine 824 may employ the on-die ECC engine 400 of FIG. 7. The control logic circuit 823** may include a mode register in which a random binary code is set.

The at least one buffer die 810 may include a via ECC engine 812 which may be configured to correct a transmission error using the transmission parity data when a transmission error is detected from the transmission data received through the TSV lines and generates error-corrected data.

The semiconductor memory device 800 may be a stack chip type memory device or a stacked memory device which conveys data and control signals through the TSV lines. The TSV lines may be also called 'through electrodes'.

A data TSV line group 832, which may be formed at one memory die **820-*p*, may include TSV lines L1, L2 to Lp, and a parity TSV line group 834** may include TSV lines L10 to Lq.

The TSV lines L1, L2 to Lp of the data TSV line group 832 and the parity TSV lines L10 to Lq of the parity TSV line group 834 may be connected to micro bumps MCB which are correspondingly formed among the memory dies 820-1 to **820-*p***.

Each of the memory dies 820-1 to **820-*p*** may include DRAM cells each including at least one access transistor and one storage capacitor.

The semiconductor memory device 800 may have a three-dimensional (3D) chip structure or a 2.5D chip structure to communicate with an external memory controller through a data bus B10. The at least one buffer die 810 may be connected with the memory controller through the data bus B10.

The via ECC engine 812 may be configured to determine whether a transmission error occurs at the transmission data received through the data TSV line group 832, based on the transmission parity data received through the parity TSV line group 834. When a transmission error is detected, the via ECC engine 812 may correct the transmission error on the transmission data using the transmission parity data. When the transmission error is uncorrectable, the via ECC engine 812 may output information (e.g., an error flag or other notification) indicating the occurrence of an uncorrectable data error.

Figure 26:
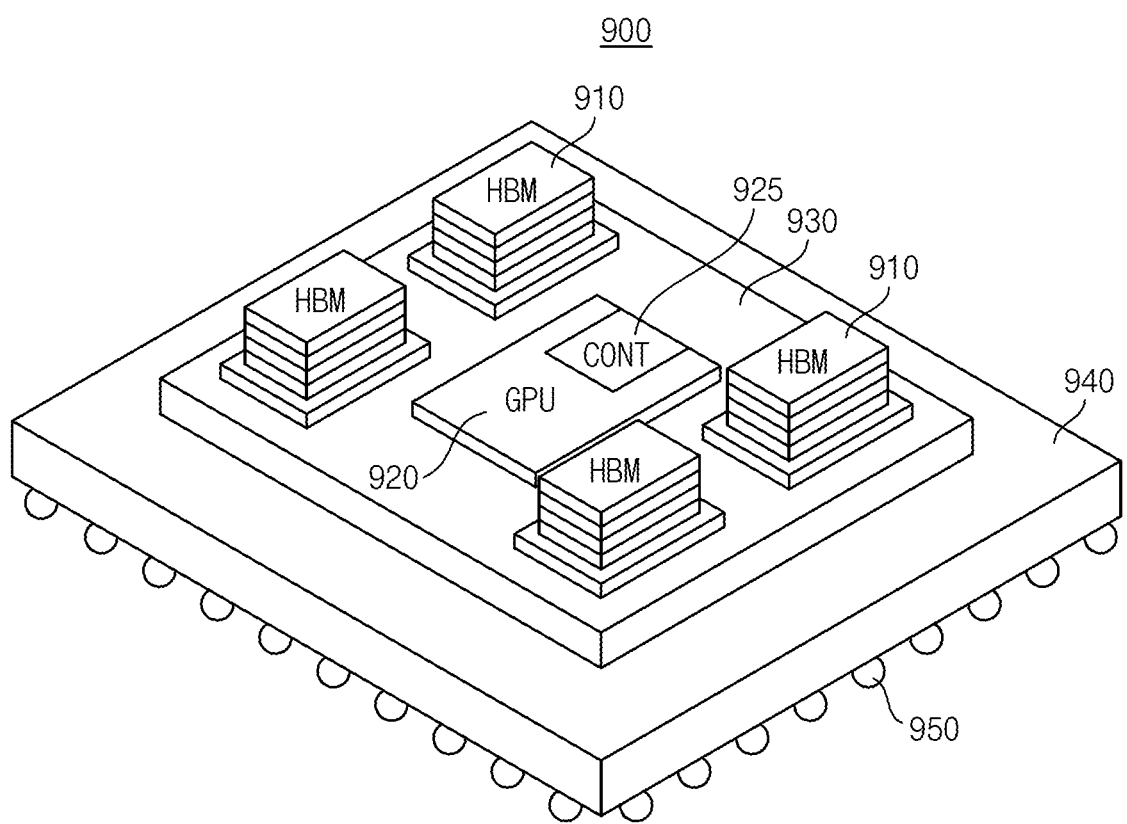
FIG. 26 is a diagram illustrating a semiconductor package including the stacked memory device, according to example embodiments.

FIG. 26 is a diagram illustrating at least a portion of an example semiconductor package 900 including the stacked memory device, according to example embodiments.

Referring to FIG. 26, the semiconductor package 900 may include one or more stacked memory devices 910 and a graphic processing unit (GPU) 920. The GPU 920 may include a memory controller (CONT) 925.

The stacked memory devices 910 and the GPU 920 may be mounted on an interposer 930, and the interposer on which the stacked memory devices 910 and the GPU 920 are mounted may be mounted on a package substrate 940. The package substrate 940 may be mounted on solder balls 950. The memory controller 925 may employ the illustrative memory controller 100 shown in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include at least one buffer die and a plurality of memory dies. Each of the memory dies may include a memory cell array, an on-die ECC engine and a control logic circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, the semiconductor memory device may generate the first main data by scrambling the second main data with the random binary code in parallel with generating a syndrome by performing an ECC decoding on the second main data read from the memory cell array and may correct at least one error bit in the first main data based on the syndrome. Because the semiconductor memory device, in one or more embodiments, does not perform data scrambling after performing the ECC decoding, the data scrambling does not need extra time. Therefore, the semiconductor memory device may reduce latency associated with a read operation while reducing pattern noise that occurs when fixed data patterns are repeated and may also reduce a size of logic associated with the data scrambling.

Aspects of the present disclosure may be applied to systems using semiconductor memory devices that employ an on-die ECC engine and a plurality of volatile memory cells. For example, aspects of the present disclosure may be applied to systems such as a smart phone, a navigation system, a notebook computer, a desk top computer and a game console that use the semiconductor memory device as a working memory.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as "above," "below," "upper" and "lower" may be used herein to indicate a position of elements, structures or features relative to one another as illustrated in the figures, rather than absolute positioning. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device, comprising:
   a memory cell array including a plurality of memory cells coupled to a plurality of word-lines and a plurality of bit-lines;
   an on-die error correction code (ECC) engine; and
   a control logic circuit configured to control the on-die ECC engine,
   wherein the on-die ECC engine, during a write operation, is configured to:
      generate a second main data by encoding a first main data received from an external device with a random binary code received from the control logic circuit;
      perform an ECC encoding on the second main data to generate a parity data; and
      store the second main data and the parity data in a target page in the memory cell array, and
   wherein the on-die ECC engine, during a read operation, is configured to:
      read the second main data and the parity data from the target page;
      perform an ECC decoding on the second main data based on the parity data to generate a syndrome in parallel with generating the first main data by encoding the second main data with the random binary code; and
      correct at least one error bit, when present, in the first main data based at least in part on the syndrome.

2. The semiconductor memory device of claim 1, wherein:
   the first main data includes a plurality of first sub-data units;
   the random binary code includes a plurality of code bits corresponding to a number of the plurality of first sub-data units; and
   the on-die ECC engine is configured to generate the second main data by encoding data bits of each of the plurality of first sub-data units with a corresponding code bit of the plurality of code bits.

3. The semiconductor memory device of claim 2, wherein the on-die ECC engine is configured to generate the second main data by performing an XOR operation on the data bits of each of the plurality of first sub-data units with the corresponding code bit of the plurality of code bits in parallel.

4. The semiconductor memory device of claim 1, wherein:
   the second main data includes a plurality of second sub-data units;
   the random binary code includes a plurality of code bits corresponding to a number of the plurality of second sub-data units; and
   the on-die ECC engine is configured to generate the first main data by encoding data bits of each of the plurality of second sub-data units with a corresponding code bit of the plurality of code bits.

5. The semiconductor memory device of claim 4, wherein the on-die ECC engine is configured to generate the first main data by performing an XOR operation on the data bits of each of the plurality of second sub-data units with the corresponding code bit of the plurality of code bits in parallel.

6. The semiconductor memory device of claim 1, wherein:
   the first main data includes a plurality of first sub-data units;
   the second main data includes a plurality of second sub-data units; and
   the on-die ECC engine includes:
      a first data scrambler configured to generate the second main data by encoding the first main data with the random binary code during the write operation;
      a write first-in, first-out (FIFO) register configured to store the plurality of second sub-data units sequentially;
      a second data scrambler configured to generate the first main data by encoding the second main data with the random binary code during the read operation;
      a read FIFO register configured to store the plurality of first sub-data units, provided from the second data scrambler, sequentially;
      an encoding/decoding logic configured to generate the parity data by performing the ECC encoding on the second main data during the write operation and configured to generate the syndrome by performing the ECC decoding on the second main data and the parity data during the read operation; and
      a data corrector configured to output a corrected main data by correcting at least one error bit in the first main data, when present, based on the syndrome.

7. The semiconductor memory device of claim 6, wherein the encoding/decoding logic includes:
   a check bit generator configured to generate check bits based on the second main data; and a syndrome generator configured to generate the syndrome based on each of the check bits matching a corresponding bit of the parity data.

8. The semiconductor memory device of claim 6, wherein the data corrector includes:
   a syndrome decoder configured to generate a decoding signal by decoding the syndrome; and
   a bit inverter configured to selectively invert at least one data bit of a plurality of data bits of the first main data based on the decoding signal.

9. The semiconductor memory device of claim 6, wherein the on-die ECC engine further includes:
   a multiplexer configured to provide the encoding/decoding logic with the second main data output from the first data scrambler during the write operation and configured to provide the encoding/decoding logic with the second main data read from the target page during the read operation, in response to a selection signal.

10. The semiconductor memory device of claim 6, wherein the random binary code includes a plurality of code bits corresponding to a number of the plurality of first sub-data units, and wherein the first data scrambler includes:
    a plurality of XOR gates configured to generate data bits of each of the plurality of second sub-data units by performing an XOR operation on data bits of each of the plurality of first sub-data units and a corresponding code bit of the plurality of code bits.

11. The semiconductor memory device of claim 6, wherein the random binary code includes a plurality of code bits corresponding to a number of the plurality of second sub-data units, and wherein the first data scrambler includes:
    a plurality of XOR gates configured to generate data bits of each of the plurality of first sub-data units by performing an XOR operation on data bits of each of the plurality of second sub-data units and a corresponding code bit of the plurality of code bits.

12. The semiconductor memory device of claim 1, comprising:
    at least one buffer die; and
    a plurality of memory dies, at least a subset of the plurality of memory dies being stacked on the at least one buffer die and configured to convey data through a plurality of through silicon via (TSV) lines, and
    wherein at least one of the plurality of memory dies includes the memory cell array, the control logic circuit and the on-die ECC engine.

13. The semiconductor memory device of claim 1, wherein the control logic circuit includes a mode register configured such that the random binary code is set in response to a command from the external device.

14. The semiconductor memory device of claim 1, wherein the first main data corresponds to data that the external device generates by encoding an original main data.

15. The semiconductor memory device of claim 1, wherein:
    the first main data includes a plurality of first sub-data units;
    the second main data includes a plurality of second sub-data units;
    the memory cell array includes a plurality of sub-array blocks arranged in a first direction and a second direction, the second direction intersecting with the first direction;
    the semiconductor memory device further includes an input/output (I/O) gating circuit connected between the memory cell array and the on-die ECC engine; and
    the control logic circuit is configured to control the I/O gating circuit such that each of the plurality of second sub-data units is stored in a same sub-array block from among the plurality of sub-array blocks.

16. A semiconductor memory device, comprising:
    a memory cell array including a plurality of memory cells coupled to a plurality of word-lines and a plurality of bit-lines;
    an on-die error correction code (ECC) engine including a first latch and a second latch; and
    a control logic circuit configured to control the on-die ECC engine,
    wherein the on-die ECC engine, during a write operation, is configured to:
        generate a scrambled main data by encoding a main data received from an external device with a random binary code received from the control logic circuit;
        perform an ECC encoding on the scrambled main data to generate a parity data; and
        store the scrambled main data and the parity data in a target page in the memory cell array, and
    wherein the on-die ECC engine, during a read operation, is configured to:
        read the scrambled main data and the parity data from the target page;
        perform an ECC decoding on the scrambled main data based at least in part on the parity data to generate a syndrome in parallel with generating the main data by encoding the scrambled main data with the random binary code; and
        correct at least one error bit, when present, in the main data based on the syndrome.

17. The semiconductor memory device of claim 16, wherein:
    the random binary code includes a plurality of code bits;
    the main data includes a plurality of first sub-data units;
    the scrambled main data includes a plurality of second sub-data units; and
    the on-die ECC engine includes:
        a first data scrambler configured to generate the scrambled main data by encoding data bits of each of the plurality of first sub-data units with a corresponding code bit of the plurality of code bits; and
        a second data scrambler configured to generate the main data by encoding data bits of each of the plurality of second sub-data units with a corresponding code bit of the plurality of code bits.

18. The semiconductor memory device of claim 17, wherein:
    the first data scrambler is configured to generate the scrambled main data main data by performing an XOR operation on the data bits of each of the plurality of first sub-data units with the corresponding code bit of the plurality of code bits in parallel; and
    the second data scrambler is configured to generate the main data main data by performing an XOR operation on the data bits of each of the plurality of second sub-data units with the corresponding code bit of the plurality of code bits in parallel.

19. A method of operating a semiconductor memory device, the semiconductor memory device comprising a memory cell array including a plurality of memory cells coupled to a plurality of word-lines and a plurality of bit-lines and an on-die error correction code (ECC) engine, the method comprising:

generating, by the on-die ECC engine, a second main data by encoding a first main data with a random binary code;

storing the second main data and a parity data in a target page in the memory cell array, the parity data being generated based at least in part on the first main data;

decoding, by the on-die ECC engine, the second main data read from the target page based at least in part on the parity data read from the target page to generate a syndrome in parallel with generating the first main data by encoding the second main data with the random binary code; and correcting, by the on-die ECC engine, at least one error bit, when present, in the first main data based at least in part on the syndrome.

20. The method of claim 19, wherein:

the first main data includes a plurality of first sub-data units;

the second main data includes a plurality of second sub-data units; and the random binary code is set in a mode register included in a control logic circuit that is configured to control the on-die ECC engine.

\* \* \* \* \*